(12) United States Patent
Hsiao

(10) Patent No.: US 10,707,902 B2
(45) Date of Patent: Jul. 7, 2020

(54) PERMUTATION NETWORK DESIGNING METHOD, AND PERMUTATION CIRCUIT OF QC-LDPC DECODER

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 167 days.

(21) Appl. No.: 16/145,207

(22) Filed: Sep. 28, 2018

(65) Prior Publication Data

US 2019/0074850 A1 Mar. 7, 2019

Related U.S. Application Data

(63) Continuation-in-part of application No. 14/981,965, filed on Dec. 29, 2015, now abandoned.

(30) Foreign Application Priority Data

Nov. 5, 2015 (TW) .............................. 104136484 A

(51) Int. Cl.
| | | |
|---|---|---|
| *H03M 13/11* | (2006.01) | |
| *H03M 13/00* | (2006.01) | |
| *G06F 11/10* | (2006.01) | |
| *G06F 3/06* | (2006.01) | |

(52) U.S. Cl.
CPC ......... *H03M 13/116* (2013.01); *G06F 3/0604* (2013.01); *G06F 3/0638* (2013.01); *G06F 3/0679* (2013.01); *G06F 11/1012* (2013.01); *H03M 13/1174* (2013.01); *H03M 13/6508* (2013.01); *H03M 13/6566* (2013.01)

(58) Field of Classification Search
CPC ............. G06F 11/1068; G11C 13/0004; G11C 11/1673; G11C 13/0069; G11C 29/52; G11C 13/004; G11C 13/0007; G11C 2213/31; G11C 2013/0078; G11C 2213/52; G11C 2213/71; G11C 2013/0045
USPC ........................................................ 714/764
See application file for complete search history.

(56) References Cited

U.S. PATENT DOCUMENTS

| | | | |
|---|---|---|---|
| 8,745,468 B1 * | 6/2014 | Zhang ................ | H03M 13/1102 714/701 |
| 9,037,945 B2 * | 5/2015 | Wu ...................... | H03M 13/116 714/756 |
| 2015/0242270 A1 * | 8/2015 | D-Abreu ................ | G11C 29/52 714/764 |

* cited by examiner

*Primary Examiner* — Albert Decady
*Assistant Examiner* — Enam Ahmed
(74) *Attorney, Agent, or Firm* — JCIPRNET

(57) ABSTRACT

A permutation network designing method and a permutation circuit using the same are provided. The method includes: identifying a predetermined check matrix of the QC-LDPC decoder, wherein the check matrix comprises M×N sub-matrices, wherein each of the sub-matrices is a Z×Z matrix, wherein Z is a default dimension value of each of the sub-matrices; constructing a second permutation network of a permutation circuit by removing a target first permutation layer from a first permutation layer according to a shift type of the check matrix, wherein the amount of a plurality of second permutation layers and the amount of the second nodes of each of the second permutation layers are set according to the default dimension value; and disposing a plurality of selectors on the second nodes of the constructed second permutation network of the permutation circuit.

14 Claims, 21 Drawing Sheets

First Permutation network
(For constructing a second permutation network corresponding to the even shift type check matrix)

◎ Default dimension value of the sub-matrix (Z): 8
◎ Permutation Layer of the permutation network (A)=
Log2(Z) = Log2(8) = 3

$$700 \underset{k}{\overbrace{\left\{\begin{pmatrix} 0 & 1 & 0 & 0 & 0 & 1 & 1 & 0 & 0 \\ 0 & 0 & 1 & 1 & 0 & 0 & 0 & 1 & 0 \\ 1 & 0 & 0 & 0 & 1 & 0 & 0 & 0 & 1 \\ 0 & 0 & 1 & 1 & 0 & 0 & 0 & 1 & 0 \\ 1 & 0 & 0 & 0 & 1 & 0 & 0 & 0 & 1 \\ 0 & 1 & 0 & 0 & 0 & 1 & 1 & 0 & 0 \end{pmatrix}\right.}^{n}}$$

$$\left\{\begin{pmatrix}1&0&0\\0&1&0\\0&0&1\end{pmatrix}\begin{pmatrix}1&0&0\\0&1&0\\0&0&1\end{pmatrix}\begin{pmatrix}1&0&0\\0&1&0\\0&0&1\end{pmatrix}\right\} \times \begin{pmatrix}A_2\\A_3\\A_1\\B_3\\B_1\\B_2\\C_1\\C_2\\C_3\end{pmatrix} = \begin{pmatrix}S_1\\S_2\\S_3\end{pmatrix}$$

911  912  913                              910

$$\Rightarrow \begin{pmatrix}A_2\\A_3\\A_1\end{pmatrix} + \begin{pmatrix}B_3\\B_1\\B_2\end{pmatrix} + \begin{pmatrix}C_1\\C_2\\C_3\end{pmatrix} = \begin{pmatrix}S_1\\S_2\\S_3\end{pmatrix}$$

$$\left\{\begin{pmatrix}1&0&0\\0&1&0\\0&0&1\end{pmatrix}\begin{pmatrix}1&0&0\\0&1&0\\0&0&1\end{pmatrix}\begin{pmatrix}1&0&0\\0&1&0\\0&0&1\end{pmatrix}\right\} \times \begin{pmatrix}A_3\\A_1\\A_2\\B_1\\B_2\\B_3\\C_2\\C_3\\C_1\end{pmatrix} = \begin{pmatrix}S_4\\S_5\\S_6\end{pmatrix}$$

921  922  923                              920

$$\Rightarrow \begin{pmatrix}A_3\\A_1\\A_2\end{pmatrix} + \begin{pmatrix}B_1\\B_2\\B_3\end{pmatrix} + \begin{pmatrix}C_2\\C_3\\C_1\end{pmatrix} = \begin{pmatrix}S_4\\S_5\\S_6\end{pmatrix}$$

FIG. 9

$$800 \underset{\searrow}{\phantom{x}} \quad 810 \underset{\swarrow}{\phantom{x}} \quad 820 \underset{\swarrow}{\phantom{x}}$$

$$\begin{pmatrix} 0 & 1 & 0 & 0 & 0 & 1 & 1 & 0 & 0 \\ 0 & 0 & 1 & 1 & 0 & 0 & 0 & 1 & 0 \\ 1 & 0 & 0 & 0 & 1 & 0 & 0 & 0 & 1 \\ 0 & 0 & 1 & 1 & 0 & 0 & 0 & 1 & 0 \\ 1 & 0 & 0 & 0 & 1 & 0 & 0 & 0 & 1 \\ 0 & 1 & 0 & 0 & 0 & 1 & 1 & 0 & 0 \end{pmatrix} \times \begin{pmatrix} A_1 \\ A_2 \\ A_3 \\ B_1 \\ B_2 \\ B_3 \\ C_1 \\ C_2 \\ C_3 \end{pmatrix} = \begin{pmatrix} S_1 \\ S_2 \\ S_3 \\ S_4 \\ S_5 \\ S_6 \end{pmatrix}$$

$$EA_1 \; EA_2 \; EA_3 \; EA_1 \; EA_2 \; EA_3 \; EA_1 \; EA_2 \; EA_3$$
$$\downarrow \quad \downarrow \quad \downarrow \quad \downarrow \quad \downarrow \quad \downarrow \quad \downarrow \quad \downarrow \quad \downarrow$$
$$\begin{array}{ccccccccc} S_3 & S_1 & S_2 & S_2 & S_3 & S_1 & S_1 & S_2 & S_3 \\ + & + & + & + & + & + & + & + & + \\ S_5 & S_6 & S_4 & S_4 & S_5 & 6_5 & S_6 & S_4 & S_5 \end{array}$$

$$\begin{pmatrix} EA_1 \\ EA_2 \\ EA_3 \\ EB_1 \\ EB_2 \\ EB_3 \\ EC_1 \\ EC_2 \\ EC_3 \end{pmatrix} = \begin{pmatrix} S_3 \\ S_1 \\ S_2 \\ S_2 \\ S_3 \\ S_1 \\ S_1 \\ S_2 \\ S_3 \end{pmatrix} + \begin{pmatrix} S_5 \\ S_6 \\ S_4 \\ S_4 \\ S_5 \\ S_6 \\ S_6 \\ S_4 \\ S_5 \end{pmatrix}$$

$$\phantom{xx}\underset{1001}{\uparrow} \quad \underset{1002}{\uparrow} \quad \underset{1003}{\uparrow}$$

FIG. 10

$$\left\{\begin{pmatrix}1 & 0 & 0\\0 & 1 & 0\\0 & 0 & 1\end{pmatrix}\begin{pmatrix}1 & 0 & 0\\0 & 1 & 0\\0 & 0 & 1\end{pmatrix}\begin{pmatrix}1 & 0 & 0\\0 & 1 & 0\\0 & 0 & 1\end{pmatrix}\right\}\begin{pmatrix}EA_2\\EA_3\\EA_1\\EB_3\\EB_1\\EB_2\\EC_1\\EC_2\\EC_3\end{pmatrix} \rightarrow \begin{pmatrix}EA_2\\EA_3\\EA_1\\EB_3\\EB_1\\EB_2\\EC_1\\EC_2\\EC_3\end{pmatrix} = \begin{pmatrix}EA_2\\EA_3\\EA_1\\EB_3\\EB_1\\EB_2\\EC_1\\EC_2\\EC_3\end{pmatrix} + \begin{pmatrix}S_1\\S_2\\S_3\\S_1\\S_2\\S_3\\S_1\\S_2\\S_3\end{pmatrix}$$

1101, 1102, 1103, 1104

$$\left\{\begin{pmatrix}1 & 0 & 0\\0 & 1 & 0\\0 & 0 & 1\end{pmatrix}\begin{pmatrix}1 & 0 & 0\\0 & 1 & 0\\0 & 0 & 1\end{pmatrix}\begin{pmatrix}1 & 0 & 0\\0 & 1 & 0\\0 & 0 & 1\end{pmatrix}\right\}\begin{pmatrix}EA_3\\EA_1\\EA_2\\EB_1\\EB_2\\EB_3\\EC_2\\EC_3\\EC_1\end{pmatrix} \rightarrow \begin{pmatrix}EA_3\\EA_1\\EA_2\\EB_1\\EB_2\\EB_3\\EC_2\\EC_3\\EC_1\end{pmatrix} = \begin{pmatrix}EA_3\\EA_1\\EA_2\\EB_1\\EB_2\\EB_3\\EC_2\\EC_3\\EC_1\end{pmatrix} + \begin{pmatrix}S_4\\S_5\\S_6\\S_4\\S_5\\S_6\\S_4\\S_5\\S_6\end{pmatrix}$$

$$\begin{pmatrix} 0 & 1 & 0 & 0 & 0 & 1 & 1 & 0 & 0 \\ 0 & 0 & 1 & 1 & 0 & 0 & 0 & 1 & 0 \\ 1 & 0 & 0 & 0 & 1 & 0 & 0 & 0 & 1 \\ 0 & 0 & 1 & 1 & 0 & 0 & 0 & 1 & 0 \\ 1 & 0 & 0 & 0 & 1 & 0 & 0 & 0 & 1 \\ 0 & 1 & 0 & 0 & 0 & 1 & 1 & 0 & 0 \end{pmatrix} \circ \begin{pmatrix} A_1 \\ A_2 \\ A_3 \\ B_1 \\ B_2 \\ B_3 \\ C_1 \\ C_2 \\ C_3 \end{pmatrix} = \begin{pmatrix} m_1 \\ m_2 \\ m_3 \\ m_4 \\ m_5 \\ m_6 \end{pmatrix}$$

$m_1 = \min(A_2, B_3, C_1)$
$m_2 = \min(A_3, B_1, C_2)$
$m_3 = \min(A_1, B_2, C_3)$
$m_4 = \min(A_3, B_1, C_2)$
$m_5 = \min(A_1, B_2, C_3)$
$m_6 = \min(A_2, B_3, C_1)$

FIG. 12

$$\left\{\begin{pmatrix}1&0&0\\0&1&0\\0&0&1\end{pmatrix}\begin{pmatrix}1&0&0\\0&1&0\\0&0&1\end{pmatrix}\begin{pmatrix}1&0&0\\0&1&0\\0&0&1\end{pmatrix}\right\}\circ\begin{pmatrix}A_2\\A_3\\A_1\\B_3\\B_1\\B_2\\C_1\\C_2\\C_3\end{pmatrix}=\begin{pmatrix}m_1\\m_2\\m_3\end{pmatrix} \quad {}^{910}$$

911　912　913

$$\Rightarrow\begin{pmatrix}A_2\\A_3\\A_1\end{pmatrix}\circ\begin{pmatrix}B_3\\B_1\\B_2\end{pmatrix}\circ\begin{pmatrix}C_1\\C_2\\C_3\end{pmatrix}=\begin{pmatrix}m_1\\m_2\\m_3\end{pmatrix}$$

$$\left\{\begin{pmatrix}1&0&0\\0&1&0\\0&0&1\end{pmatrix}\begin{pmatrix}1&0&0\\0&1&0\\0&0&1\end{pmatrix}\begin{pmatrix}1&0&0\\0&1&0\\0&0&1\end{pmatrix}\right\}\circ\begin{pmatrix}A_3\\A_1\\A_2\\B_1\\B_2\\B_3\\C_2\\C_3\\C_1\end{pmatrix}=\begin{pmatrix}m_4\\m_5\\m_6\end{pmatrix} \quad {}^{920}$$

921　922　923

$$\Rightarrow\begin{pmatrix}A_3\\A_1\\A_2\end{pmatrix}\circ\begin{pmatrix}B_1\\B_2\\B_3\end{pmatrix}\circ\begin{pmatrix}C_2\\C_3\\C_1\end{pmatrix}=\begin{pmatrix}m_4\\m_5\\m_6\end{pmatrix}$$

FIG. 13

◎ Default dimension value of the sub-matrix (Z): 8

◎ Permutation Layer of the permutation network (A)= Log2(Z) = Log2(8) = 3

PERMUTATION NETWORK DESIGNING METHOD, AND PERMUTATION CIRCUIT OF QC-LDPC DECODER

CROSS-REFERENCE TO RELATED APPLICATION

This is a continuation-in-part application of and claims the priority benefit of U.S. application Ser. No. 14/981,965, filed on Dec. 29, 2015, now pending, which claims the priority benefit of Taiwan application serial no. 104136484, filed on Nov. 5, 2015. The entirety of each of the above-mentioned patent applications is hereby incorporated by reference herein and made a part of this specification.

BACKGROUND

1. Technology Field

The disclosure is directed to a network designing technique and more particularly, to a permutation network designing method, and a permutation circuit of a QC-LDPC decoder of a storage controller that are applicable to a storage device configured with a rewritable non-volatile memory module.

2. Description of Related Art

Along with the widespread of digital cameras, cell phones, and MP3 players in recently years, the consumers' demand to storage media has increased drastically. Because a rewritable non-volatile memory (e.g., a flash memory) is capable of providing features such as data non-volatility, low power consumption, small volume, and non-mechanical structure, the rewritable non-volatile memory is adapted to be built in various portable multi-media apparatuses.

Generally speaking, in order to avoid data read from a memory apparatus from encountering errors, data to be stored in the memory apparatus is encoded before being stored. When the data is to be read, the entire encoded data is read from the memory apparatus and be decoded. Thereby, errors that may be probably exist therein may be corrected through a decoding procedure. During the decoding procedure, error correcting codes are used to determine whether one or more errors in a read codeword(read data), and correct the determined errors. One of the famous codes is known as quasi-cyclic low-density parity check (QC-LDPC) codes. In QC-LDPC, a permutation network plays an important role for decoding efficiency and high data rates. Conventionally, a full sized multilayer permutation network will be implemented, but the difficulty of placing chips/selectors (electronic components in the permutation network of the QC-LDPC decoder) and the difficulty of routing wires connecting to the components become greater when the size of the permutation network becomes larger. Another problem is that the processing cycle of the decoding procedure would become longer due to the longer operation path (of the routing wires) of the larger conventional permutation network (The larger permutation network needs more time for completing whole decoding procedure).

Therefore, how to design the permutation network of the QC-LDPC decoder to decrease the time/power consumption of a decoding procedure and decrease the hardware cost of permutation circuit to further improve the efficiency of the QC-LDPC decoder is one of topics of persons skilled in the art.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY

The disclosure is directed to a permutation network designing method, and a permutation circuit of a QC-LDPC decoder capable of decreasing the cost of the permutation circuit of the QC-LDPC decoder by determining less selectors and routing wires needed for being disposed in the permutation network of the permutation circuit.

According to an exemplary embodiment of the disclosure, a permutation network designing method for a permutation circuit of a quasi-cyclic low-density parity check (QC-LDPC) decoder corresponding to a rewritable non-volatile memory module is provided. The method includes identifying a size of a physical page of the rewritable non-volatile memory module as a page size, wherein the physical page is configured to store a plurality of codewords; obtaining a length of each of the codewords as a codeword length according to the amount of the codewords and the page size; identifying a predetermined check matrix of the QC-LDPC decoder, wherein the check matrix comprises M×N sub-matrices, wherein each of the sub-matrices is a Z×Z matrix, wherein Z is a default dimension value of each of the sub-matrices, and the default dimension value is a quotient obtained by dividing the codeword length with N; calculating a first value according to the default dimension value, and identifying a first permutation network according to the first value, the default dimension value, and a shift type of the check matrix, wherein the first permutation network comprises a plurality of first permutation layers arranged sequentially, and each of the first permutation layers has the same amount of first nodes, wherein the amount of the first permutation layers is set by the first value, and the amount of the first nodes of each of the first permutation layers is set by the default dimension value, wherein every first node of one of the first permutation layers connects to a pair of first nodes of the next one first permutation layer among the first permutation layers; identifying a target first permutation layer among the first permutation layers of the first permutation network according to the shift type of the check matrix, and constructing a second permutation network by removing the target first permutation layer from the first permutation network; and disposing a plurality of selectors on a plurality of second nodes of the second permutation network of the permutation circuit, and disposing a plurality of routing wires into the permutation circuit to connect the selectors according to the second permutation network, wherein the selectors further respectively connect to a decoding controller of the QC-LDPC decoder, wherein the decoding controller is configured to control the selectors to shift a plurality of first variable groups corresponding to a target codeword as a plurality of second variable groups, wherein the second variable groups are respectively shifted according to a plurality of target offsets corresponding to the first variable groups and the second variable groups, wherein the target offsets are identified according to the check matrix.

According to another exemplary embodiment of the disclosure, a permutation circuit of a quasi-cyclic low-density parity check (QC-LDPC) decoder of an error checking and correcting circuit of a storage controller is provided, wherein the storage controller is configured to control a storage device having a rewritable non-volatile memory module, and the QC-LDPC decoder is configured to perform a decoding procedure on a target codeword, wherein the storage controller further includes a memory interface control circuit and a processor. The memory interface control circuit is configured to couple to the rewritable non-volatile memory module, wherein the rewritable non-volatile memory module has a plurality of physical pages, and the size of each of the physical pages is identified as a page size, wherein the physical page is configured to store a plurality of codewords, and the target codeword is read from a target physical page among the physical pages, wherein a length of each of the codewords is obtained as a codeword length according to the amount of the codewords and the page size. The processor is coupled to the error checking and correcting circuit and the memory interface control circuit. The memory interface control circuit transmits the target codeword read from the rewritable non-volatile memory module to the error checking and correcting circuit, and the processor is configured to instruct the error checking and correcting circuit to perform the decoding procedure on the target codeword. The permutation circuit includes a plurality of selectors, a plurality of routing wires connecting to each of the selectors, a plurality of input ends, and a plurality of output ends, wherein a predetermined check matrix of the QC-LDPC decoder is identified, and the check matrix comprises M×N sub-matrices, wherein each of the sub-matrices is a Z×Z matrix, wherein Z is a default dimension value of each of the sub-matrices, and the default dimension value is a quotient obtained by dividing the codeword length with N, wherein a first value is calculated according to the default dimension value, wherein a second permutation network for disposing the selectors and routing wires into the permutation circuit is constructed by removing a target first permutation layer from a first permutation network, wherein the first permutation network is identified according to the first value, the default dimension value, and a shift type of the check matrix, wherein the first permutation network comprises a plurality of first permutation layers arranged sequentially, and each of the first permutation layers has the same amount of first nodes, wherein the amount of the first permutation layers is set by the first value, and the amount of the first nodes of each of the first permutation layers is set by the default dimension value, wherein every first node of one of the first permutation layers connects to a pair of first nodes of the next one first permutation layer among the first permutation layers, wherein the target first permutation layer among the first permutation layers of the first permutation network according to the shift type of the check matrix, wherein a plurality of selectors are disposed on a plurality of second nodes of the second permutation network of the permutation circuit, and a plurality of routing wires are disposed into the permutation circuit to connect the selectors according to the second permutation network, wherein the selectors further respectively connect to a decoding controller of the QC-LDPC decoder, wherein the decoding controller is configured to control the selectors to shift a plurality of first variable groups corresponding to the target codeword as a plurality of second variable groups, wherein the second variable groups are respectively shifted according to a plurality of target offsets corresponding to the first variable groups and the second variable groups, wherein the target offsets are identified according to the check matrix.

To sum up, in the embodiments of the disclosure, the provided permutation network designing method can construct an improved second permutation network used for disposing less selectors and routing wires in the permutation circuit of a QC-LDPC decoder by removing a target first permutation layer from a first permutation network according to the shift type of a check matrix of the QC-LDPC decoder, such that the permutation circuit's hardware cost would be reduced, and the power consumption and generated heat would be decreased accordingly. Furthermore, the decoding performance of the provided permutation circuit is not much decreased while saving some hardware elements for construct the permutation circuit.

It should be understood, however, that this Summary may not contain all of the aspects and embodiments of the disclosure, is not meant to be limiting or restrictive in any manner, and that the disclosure as disclosed herein is and will be understood by those of ordinary skill in the art to encompass obvious improvements and modifications thereto.

In order to make the aforementioned and other features and advantages of the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 7 is a schematic diagram illustrating a parity check matrix according to an exemplary embodiment of the disclosure.

FIG. 8 is a schematic diagram illustrating a parity check procedure according to an exemplary embodiment of the disclosure.

FIG. 9 is a schematic diagram of obtaining a syndrome set corresponding to the parity check procedure according to an exemplary embodiment of the disclosure.

FIG. 10 and FIG. 11 are schematic diagrams of obtaining a syndrome set corresponding to the bit-flipping algorithm according to another exemplary embodiment of the disclosure.

FIG. 12 and FIG. 13 are schematic diagrams of obtaining a minimum value set corresponding to a min-sum algorithm according to another exemplary embodiment of the disclosure.

DESCRIPTION OF THE EMBODIMENTS

Figure 1:
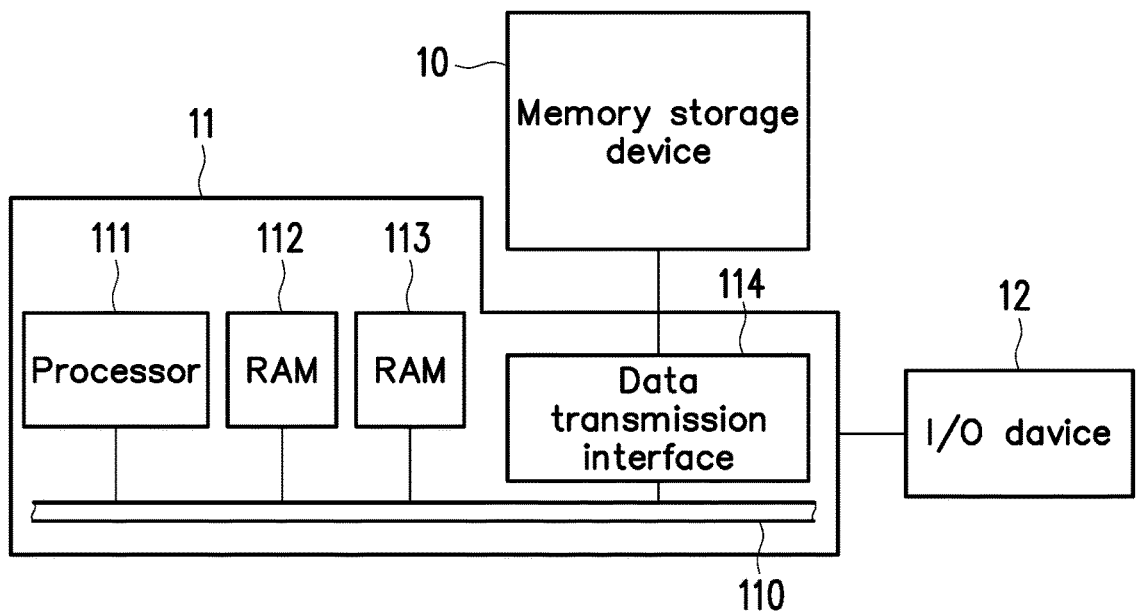
FIG. 1 is a schematic diagram illustrating a host system, a memory storage device and an input/output (I/O) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
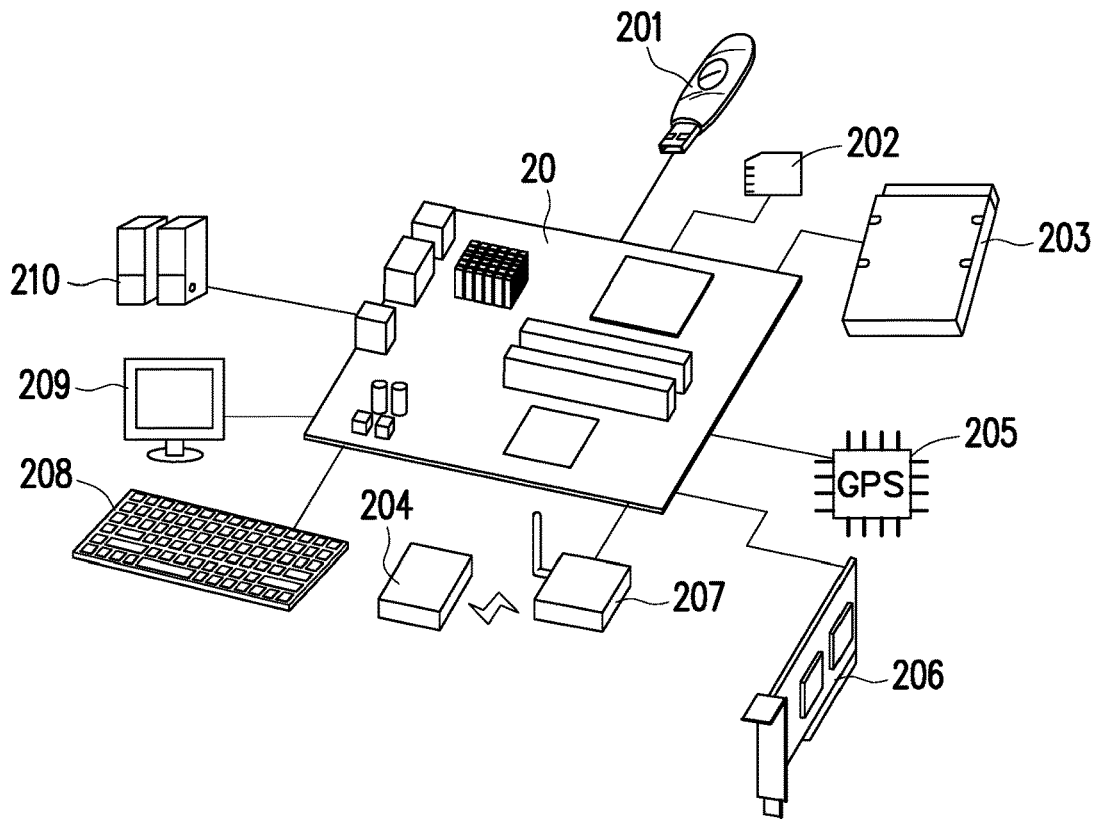
FIG. 2 is a schematic diagram illustrating a host system, a memory storage device and an I/O device according to another exemplary embodiment the disclosure.

FIG. 1 is a schematic diagram illustrating a host system, a memory storage device and an input/output (I/O) device according to an exemplary embodiment of the disclosure. FIG. 2 is a schematic diagram illustrating a host system, a memory storage device and an I/O device according to another exemplary embodiment the disclosure.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are coupled to a system bus 110.

In the present embodiment, the host system 11 is coupled to the memory storage device 10 through the data transmission interface 114. For example, the host system 11 may store data in or read data from the memory storage device 10 through the data transmission interface 114. Additionally, the host system 11 is coupled to the I/O device 12 through the system bus 110. For example, the host system 11 may transmit a signal to or receive a signal from the I/O device 12 through the system bus 110.

In the present embodiment, the processor 111, the RAM 112, the ROM 113 and the data transmission interface 114 are configured on a motherboard 20 of the host system 11. The number of the data transmission interface 114 may be one or plural. The motherboard 20 is coupled with the memory storage device 10 in a wired or a wireless manner through the data transmission interface 114. The memory storage device 10 is, for example, a flash drive 201, a memory card 202, a solid state drive (SSD) 203 or a wireless memory storage device 204. The wireless memory storage device 204 may be a memory storage device employing various wireless communication techniques, such as a near field communication (NFC) memory storage apparatus, a wireless fidelity (Wi-Fi) memory storage apparatus, a Bluetooth memory storage apparatus or a Bluetooth memory storage apparatus (e.g., an iBeacon) with low power consumption and so on. Additionally, the motherboard 20 may also be coupled to a variety of I/O devices, such as a global positioning system (GPS) module 205, a network interface card 206, a wireless transmission device 207, a keyboard 208, a display 209, and a speaker 210 through the system bus 110. For example, in an embodiment, the motherboard 20 may access the wireless memory storage device 204 through the wireless transmission device 207.

Figure 3:
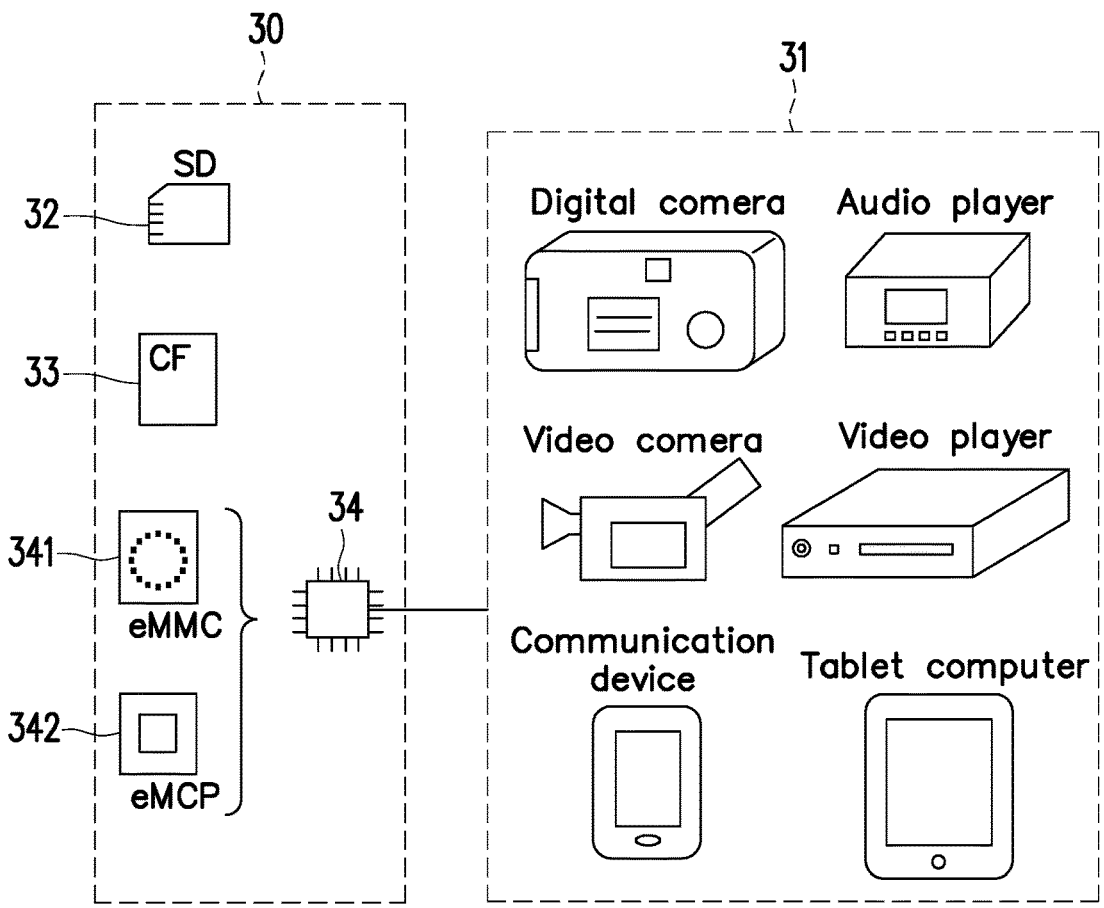
FIG. 3 is a schematic diagram illustrating a host system and a memory storage device according to another exemplary embodiment the disclosure.

In an embodiment, the aforementioned host system may substantially be any system used together with the memory storage device for storing data. Even though the host system is described as a computer system in the above exemplary embodiment, however, FIG. 3 is a schematic diagram illustrating a host system and a memory storage device according to another exemplary embodiment the disclosure. Referring to FIG. 3, in another exemplary embodiment, a host system 31 may also be a system, such as a digital camera, a video camera, a communication device, an audio player, a video player, a tablet computer and so on, while a memory storage device 30 may be a non-volatile memory used thereby, such as an secure digital (SD) card 32, a compact flash (CF) card 33 or an embedded storage device 34. The embedded storage device 34 includes an embedded storage device of any kind, where a memory module of any kind is directly coupled to a substrate of the host system, such as an embedded multimedia card (eMMC) 341 and/or an embedded multi-chip package (eMCP) storage device 342.

Figure 4:
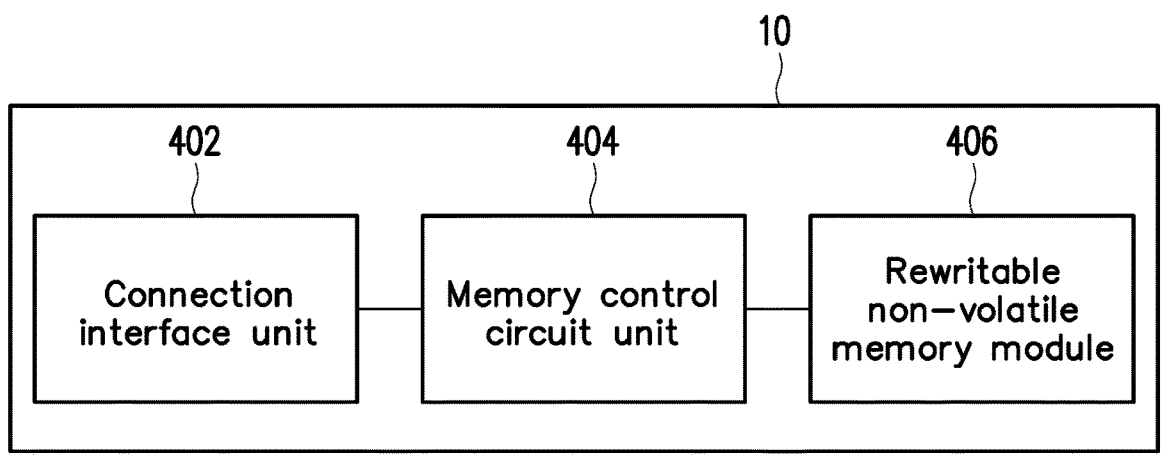
FIG. 4 is a schematic block diagram illustrating the memory storage device according to an exemplary embodiment the disclosure.

FIG. 4 is a schematic block diagram illustrating the memory storage device according to an exemplary embodiment the disclosure.

Referring to FIG. 4, the memory storage device 10 includes a connection interface unit 402, a memory control circuit unit 404 and a rewritable non-volatile memory module 406.

In the present embodiment, the connection interface unit 402 complies with the serial advanced technology attachment (SATA) standard. However, the disclosure is not limited thereto, and the connection interface unit 402 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the SD interface standard, the ultra high speed-I (UHS-I) standard, the ultra high speed-II (UHS-II) standard, the memory stick (MS) standard, the multi-chip package interface standard, the multi media card (MMC) standard, the eMMC interface standard, the universal flash storage (UFS) interface standard, the eMCP interface standard, the CF interface standard, the integrated device electronics (IDE) standard, or other suitable standards. The connection interface unit 402 may be packaged with the memory control circuit unit 404 in a chip, or disposed outside of a chip including the memory control circuit unit 404.

The memory control circuit unit 404 is configured for executing a plurality of logic gates or control commands which are implemented in a hardware form or in a firmware form and perform operations such as data writing, reading or erasing in the rewritable non-volatile memory module 406 according to commands of the host system 11.

The rewritable non-volatile memory module 406 is coupled to the memory control circuit unit 404 and configured to store data written by the host system 11. The rewritable non-volatile memory module 406 is a single level cell (SLC) NAND flash memory module (i.e., a flash memory module in which a memory cell may store data of 1 bit), a multi level cell (MLC) NAND flash memory module (i.e., a flash memory module in which a memory cell may store data of 2 bits), a triple level cell (TLC) NAND flash memory module (i.e., a flash memory module in which a memory cell may store data of 3 bits), other flash memory modules or other memory modules with the same characteristics.

Figure 5A:
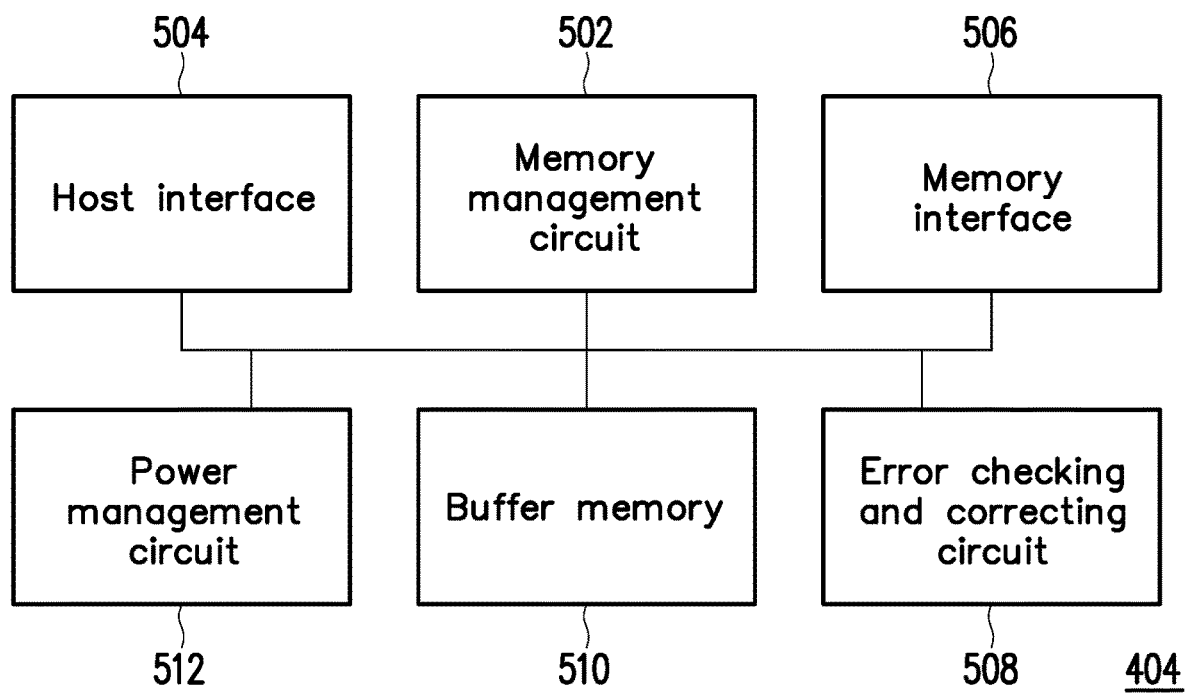
FIG. 5A is a schematic block diagram illustrating the memory control circuit unit according to an exemplary embodiment of the disclosure.

FIG. 5A is a schematic block diagram illustrating the memory control circuit unit according to an exemplary embodiment of the disclosure.

Referring to FIG. 5A, the memory control circuit unit 404 includes a memory management circuit 502, a host interface 504, a memory interface 506 and an error checking and correcting circuit 508.

The memory management circuit 502 is configured to control the overall operation of the memory control circuit unit 404. Particularly, the memory management circuit 502 has a plurality of control instructions, and when the memory storage device 10 is operated, the control instructions are executed to perform operations such as, data writing, data reading and data erasing. The operation of the memory management circuit 502 will be described below, which is equivalent to the operation of the memory control circuit unit 404.

In the present embodiment, the control instructions of the memory management circuit 502 are implemented in a form of firmware. For example, the memory management circuit 502 includes a microprocessor unit (not shown) and a read-only memory (ROM, not shown), where the control instructions are burned into the ROM. When the memory storage device 10 is operated, the control instructions are executed by the microprocessor unit to perform a data writing operation, a data reading operation, a data erasing operation, and so on.

In another exemplary embodiment, the control instructions of the memory management circuit 502 may also be stored in a specific area (for example, a system area in a memory module exclusively used for storing system data) of the rewritable non-volatile memory module 406 in a form of program codes. For example, the memory management circuit 502 includes a microprocessor unit (not shown), a read-only memory (ROM, not shown) and a random access memory (RAM, not shown). In particular, the ROM has a boot code, and when the memory control circuit unit 104 is enabled, the microprocessor unit first executes the boot code to load control instructions from the rewritable non-volatile memory module 406 into the RAM of the memory management circuit 502. Afterwards, the microprocessor unit executes the control instructions to perform a data writing operation, a data reading operation, a data erasing operation, and so on.

Furthermore, in another exemplary embodiment, the control instructions of the memory management circuit 502 may also be implemented in a form of hardware. For example, the memory management circuit 502 may include a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical units of the rewritable non-volatile memory module 406; the memory writing circuit is configured to issue a write command sequence to the rewritable non-volatile memory module 406 to write data into the rewritable non-volatile memory module 406; the memory reading circuit is configured to issue a read command sequence to the rewritable non-volatile memory module 406 to read data from the rewritable non-volatile memory module 406; the memory erasing circuit is configured to issue an erase command sequence to the rewritable non-volatile memory module 406 to erase data from the rewritable non-volatile memory module 406; and the data processing circuit is configured to process data to be written into the rewritable non-volatile memory module 406 and data to be read from the rewritable non-volatile memory module 406. Each of the write command sequence, the read command sequence and the erase command sequence may include one or a plurality of program codes or instruction codes and is configured to instruct the rewritable non-volatile memory module 406 to perform corresponding writing, reading and erasing operations.

The host interface 504 is coupled to the memory management circuit 502 and configured to receive and identify commands and data transmitted from the host system 11. Namely, the commands and data transmitted by the host system 11 are transmitted to the memory management circuit 502 through the host interface 504. In the present embodiment, the host interface 504 complies with the SATA standard. However, it should be understood that the present disclosure is not limited thereto, and the host interface 504 may also comply with the PATA standard, the IEEE 1394 standard, the PCI Express standard, the USB standard, the SD standard, the UHS-I interface standard, the UHS-II interface standard, the MS standard, the MMC standard, the eMMC standard, the UFS standard, the CF standard, the IDE standard or other appropriate data transmission standards.

The memory interface 506 is coupled to the memory management circuit 502 for accessing the rewritable non-volatile memory module 406. In other words, the data to be written into the rewritable non-volatile memory module 406 is converted to an acceptable format for the rewritable non-volatile memory module 406 through the memory interface 506. To be specific, if the memory management circuit 502 intends to access the rewritable non-volatile memory module 406, the memory interface 506 transmits corresponding command sequences. For example, the command sequences may include a write command sequence instructing to write data, a read command sequence instructing to read data, an erasing command sequence instructing to erase data and a variety of corresponding command sequences configured to instruct to perform various memory operations (e.g., an operation of changing a read voltage level, an operation of performing a garbage collection procedure, and so on), which will not be repeatedly described one by one. The command sequences are, for example, generated by the memory management circuit 502 and transmitted to the rewritable non-volatile memory module 406 through the memory interface 506. The command sequences may include one or a plurality of signals or data on a bus. The signals or data may include instruction codes or program codes. For example, a read command sequence may include information, such as an identification code for reading, a memory address and so on.

The error checking and correcting circuit 508 is coupled to the memory management circuit 502 and configured to perform an error checking and correcting procedure for ensuring data integrity. To be specific, when the memory management circuit 502 receives a writing command from the host system 11, the error checking and correcting circuit 508 generates an error correcting code (ECC) and/or an error detecting code (EDC) corresponding to the write command, and the memory management circuit 502 writes the data corresponding to the write command and the corresponding ECC and/or EDC into the rewritable non-volatile memory module 406. Thereafter, when reading the data from the rewritable non-volatile memory module 406, the memory management circuit 502 simultaneously reads the ECC and/or EDC corresponding to the data, and the error checking and correcting circuit 508 performs the error checking and correcting procedure on the read data according to the ECC and/or EDC.

In the present embodiment, the error checking and correcting circuit 508 uses a low density parity code (LDPC). However, in another exemplary embodiment, the error checking and correcting circuit 508 may also use a BCH code, a convolutional code, a turbo code, or a bit flipping encoding/decoding algorithm.

In an embodiment, the memory control circuit unit 404 further includes a buffer memory 510 and a power management circuit 512. The buffer memory 510 is coupled to the memory management circuit 502 and configured to temporarily store the data and commands from the host system 11 or the data from the rewritable non-volatile memory module 406. The power management circuit 512 is coupled to the memory management circuit 502 and configured to control the power of the memory storage device 10.

In the present embodiment, the memory management circuit 502 configures logic units for mapping physical units in the rewritable non-volatile memory module 406. For example, in the present embodiment, the host system 11 access data in the rewritable non-volatile memory module 406 through logic addresses, and thus, each logic unit refers to a logic address. However, in another exemplary embodiment, each logic unit may also be referred to a logic sector, a logic page or composed of a plurality of successive logic addresses. Each logic unit is mapped to one or more physical units. In the present embodiment, a physical unit refers to a physical block. However, in another exemplary embodiment, a physical unit may also be a physical address, a physical sector, a physical page or composed of a plurality of successive physical addresses, which is not limited in the disclosure.

The memory management circuit 502 records a mapping relationship between the logic units and the physical units in a logic-physical mapping table. When the host system 11 intends to read data from the memory storage device 10 or write data into the memory storage device 10, the memory management circuit 502 may perform a data accessing operation on the memory storage device 10 according to the logic-physical mapping table.

Figure 5B:
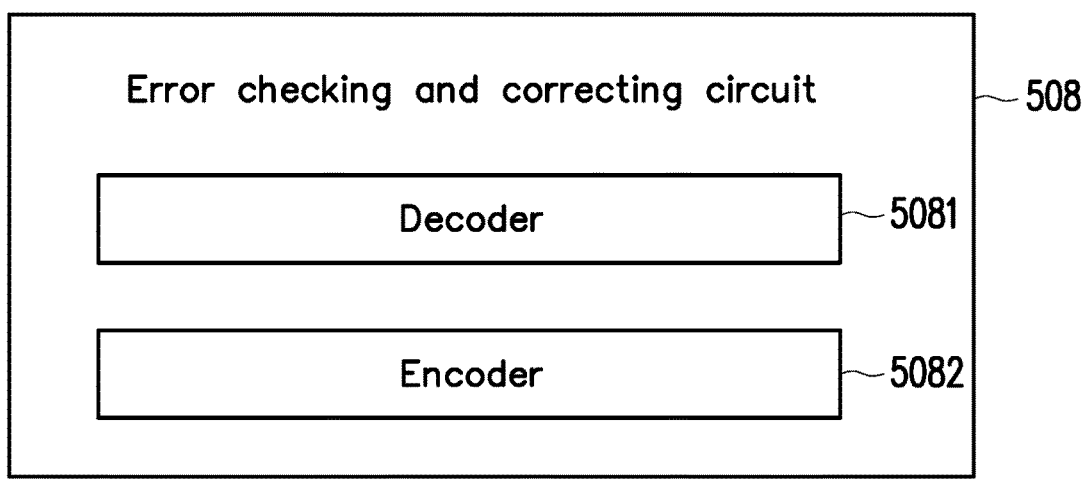
FIG. 5B is a schematic block diagram illustrating an error checking and correcting circuit of the memory control circuit unit according to an exemplary embodiment of the disclosure.

FIG. 5B is a schematic block diagram illustrating an error checking and correcting circuit of the memory control circuit unit according to an exemplary embodiment of the disclosure. Referring to FIG. 5B, the error checking and correcting circuit 508 includes a decoder 5081 for handling the decoding operation and an encoder 5082 for handling an encoding operation. More specifically, the error checking and correcting circuit 508 uses the Quasi-Cyclic LDPC (QC-LDPC) algorithm to perform an iterative decoding operation multiple times for decoding the to-be-decoded codeword, and the decoder 5081 in the embodiment below is the QC-LDPC decoder, for example.

In this embodiment, the decoding operation performed by the error checking and correcting circuit 508 on one data (codeword) includes an initial syndrome calculation operation which can be used to obtain a final syndrome for determining whether the decoding is correct. Then, whether it is required to perform one or more subsequent iterative operations may be determined according to whether the decoding is correct. Each time (each round) in the end of the iterative operation, the final syndrome corresponding to the current codeword is also calculated so as to determine whether a current iterative operation is successful. If the decoding is successful (the codeword generated after the decoding is correct, i.e., a valid codeword), the current iterative operation is ended and the entire decoding operation for that codeword is also ended; if the decoding is failed (the codeword generated after the decoding is incorrect, i.e., an invalid codeword), the current iterative operation is ended, and one new (next round) iterative operation is re-started.

In this embodiment, a total number of the iterative operations performed in each decoding operation will be recorded. In each decoding operation, the iterative operation is continuously performed until the total number of the iterative operations reaches a default upper limit value. Based on demands, manufacturers can set the default upper limit value, which is not particularly limited in the invention. The further details of the LDPC algorithm used by the error checking and correcting circuit 508 would be described below with reference to FIG. 6.

Figure 5C:
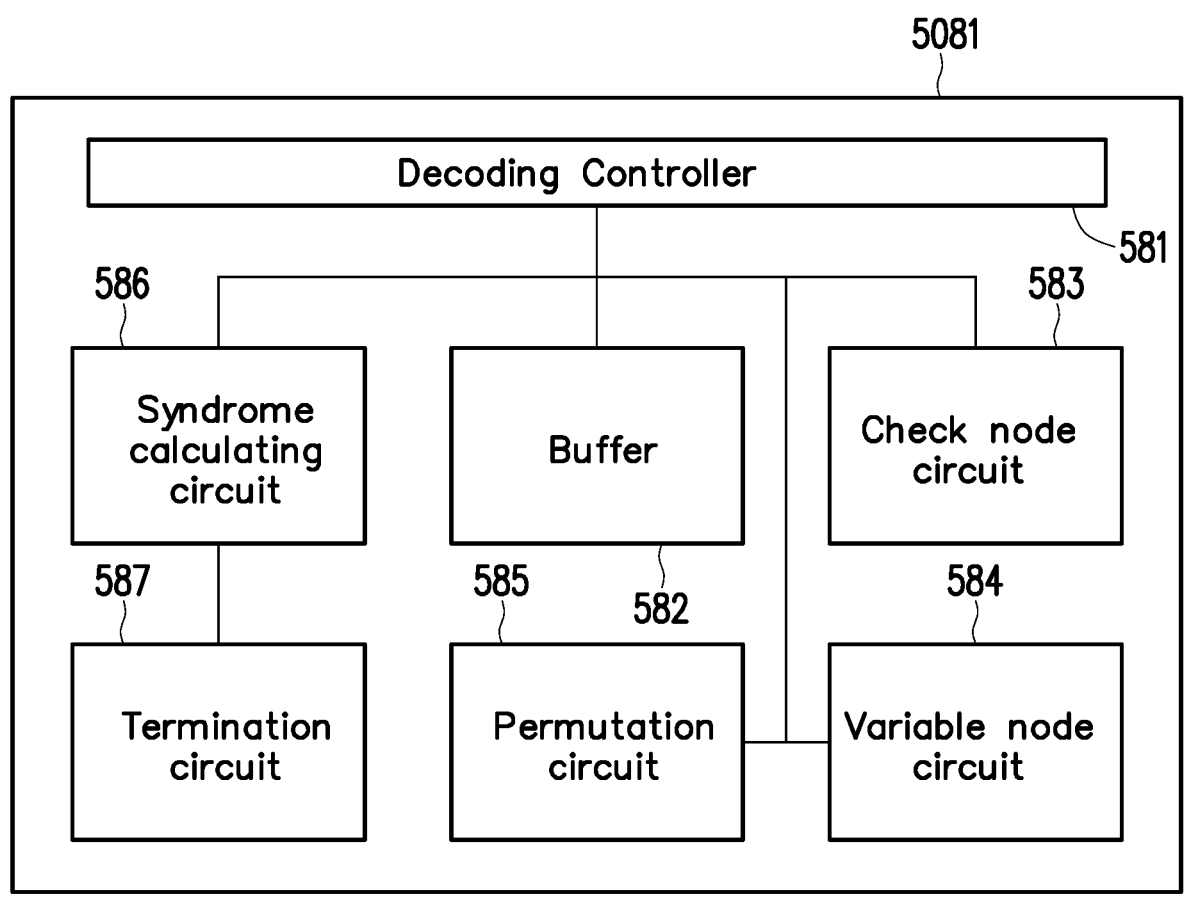
FIG. 5C is a schematic block diagram illustrating a decoder of the error checking and correcting circuit according to an exemplary embodiment of the disclosure.

FIG. 5C is a schematic block diagram illustrating a decoder of the error checking and correcting circuit according to an exemplary embodiment of the disclosure. Referring to FIG. 5C, in the present embodiment, the decoder 5081 includes a decoding controller 581, a buffer 582, a check node circuit 583, a variable node circuit 584, a permutation circuit 585, a syndrome calculating circuit 586 and a termination circuit 587. The decoding controller 581 is coupled to the buffer 582, the check node circuit 583, the variable node circuit 584, the permutation circuit 585, the syndrome calculating circuit 586 and the termination circuit 587.

The decoding controller 581 is configured to manage the whole processes of a while performing decoding procedure according to the instruction issued from the memory management circuit 502. Furthermore, the decoding controller 581 is configured to receive the codeword (also referred to as target codeword) to be decoded and group a plurality of data bit values (e.g., there are n data bit values) of the codeword into a plurality of data bit value sets (e.g., N data bit value sets, where N=n/Z) according to a (default) parity check matrix (also referred to as a sparse parity check matrix or check matrix). For example, according to a sequence of all the data bit values in the codeword, started from a first data bit value, each Z data bit values are grouped into one data bit value set.

In the present embodiment, the rewritable non-volatile memory module 406 includes a plurality of physical pages which would be grouped into a plurality of physical blocks. The length (space) of each of the physical pages is preset as a page size. Each of the physical pages is configured to store a plurality of codewords.

The buffer 582 is configured to temporarily store data, such as a plurality of variables (or variable groups) corresponding to the codeword, the check matrix, Log-Likelihood Ratio (LLR) table, or other suitable data used in the decoding procedure.

In the present embodiment, the decoding controller 581 is further configured to perform an initialization on the target codeword while starting to perform the decoding procedure on the target codeword. During the initialization, the decoding controller 581 is configured to obtain a plurality of variables by, for example, looking-up a stored decoding table according to the target codeword, wherein the variables obtained by the initialization also referred to as initial variables. In one embodiment, the decoding table is the LLR table, and the initial variables are the LLRs corresponding to those data bits values of the target codeword. Each of the LLRs represents a reliability (reliability value) of corresponding data bits value. The value of each of LLRs may be set by a plurality of bits, and the amount of the bits of the value of one LLR is predetermined by a preset fineness value. For example, assuming that the preset fineness value is 5, and the range of this 5 bits values of one LLR may be set as −16 to 15 (total size of the range is 32, i.e., $2^5$), wherein the 5 bits value of one LLR of one data bit value is a calculation result of the Log(PR0/PR1), wherein the PR0 indicates the possibility of which the said data bit value of the codeword is "0", the PR1 indicates the possibility of which the said data bit value of the codeword is "1", and PR0 plus PR1 is equal to 1. In other words, if the LLR of one data bit value is −16, the said data bit value is most likely to be 1; if the LLR of one data bit value is 15, the said data bit value is most likely to be 0; and if the LLR of one data bit value is 0, the possibility of which the said data bit value is 1 and the possibility of which the said data bit value is 0 are the same.

The plurality of variables would be grouped into variable groups by the decoding controller 581 according to a default dimension value (Z) of the sub-matrix of the check matrix. For example, assuming that the default dimension value is 256, and the amount of the data bit values is 18432. 18432 variables corresponding to 18432 data bit values would be obtained by the initialization, and 18432 initial variables would be grouped into 72 initial variable groups (e.g., 18432/256=72).

The check node circuit 583 is configured to perform an extreme value search operation on a plurality layers of variable groups to find a plurality of minimum values (one extreme value) corresponding to each of the layers of the variable groups. Specifically, after the initialization, the decoding controller 581 transmits the initial variable groups to the permutation circuit 585 to perform a shifting operation on these initial variable groups according to the check matrix, so as to obtain a plurality of shifted variable groups. After the shifting operation, the check node circuit 583 performs an extreme value search operation on a plurality layers of shifted variable groups to find a plurality of minimum values (one extreme value) corresponding to each of the layers of the shifted variable groups.

The variable node circuit 584 is configured to add the plurality of the minimum values to the layers of the shifted variable groups, so as to obtain a plurality of check variable groups.

The permutation circuit 585 is configured to perform a shifting operation on a plurality of inputted variables of each of the variable groups to output a plurality of shifted variables of each of the shifted variable groups according to the check matrix.

The syndrome calculating circuit 586 is configured to sequentially perform syndrome calculation operations respectively on the check variable groups according to the check matrix, so as to obtain a plurality of temporary syndromes and the final syndrome corresponding to the target codeword.

The termination circuit 587 is configured to determine whether to end the decoding procedure performed on the current target codeword according to the latest obtained final syndrome corresponding to the target codeword. Specifically, the termination circuit 587 determines whether a plurality of values in the final syndrome are all zero (i.e., "0"). If the values in the final syndrome are all zero, the target codeword is determined as correct by the termination circuit 587, and the termination circuit 587 instructs the decoding controller 581 to terminate whole decoding procedure and output the final decoded target codeword (current iterative operation of the decoding procedure would be end, and no next iterative operation would be performed); If the values in the final syndrome are not all zero (i.e., with one or more "1" included), the target codeword is determined as incorrect by the termination circuit 587, and the termination circuit 587 instructs the decoding controller 581 to end current iterative operation of the decoding procedure and perform a next iterative operation. In other words, the termination circuit 587 may determine whether terminate the whole decoding operation according to the latest final syndrome obtained each time. In another aspect, the termination circuit 587 may terminate the whole decoding operation in response to the amount (times) of all performed iterative decoding operations(processes) exceeds a default threshold value.

The parity check matrix is a matrix composed of M*N parity check sub-matrices (also referred to as sub-matrices). Z is a matrix size (default dimension value) of the parity check sub-matrix of the parity check matrix (e.g., the parity check sub-matrix is a matrix with a size of Z×Z), and a total number of the data bit value of each data bit value set is Z. The data bit value includes a bit value "0" and a bit value "1".

Figure 5D:
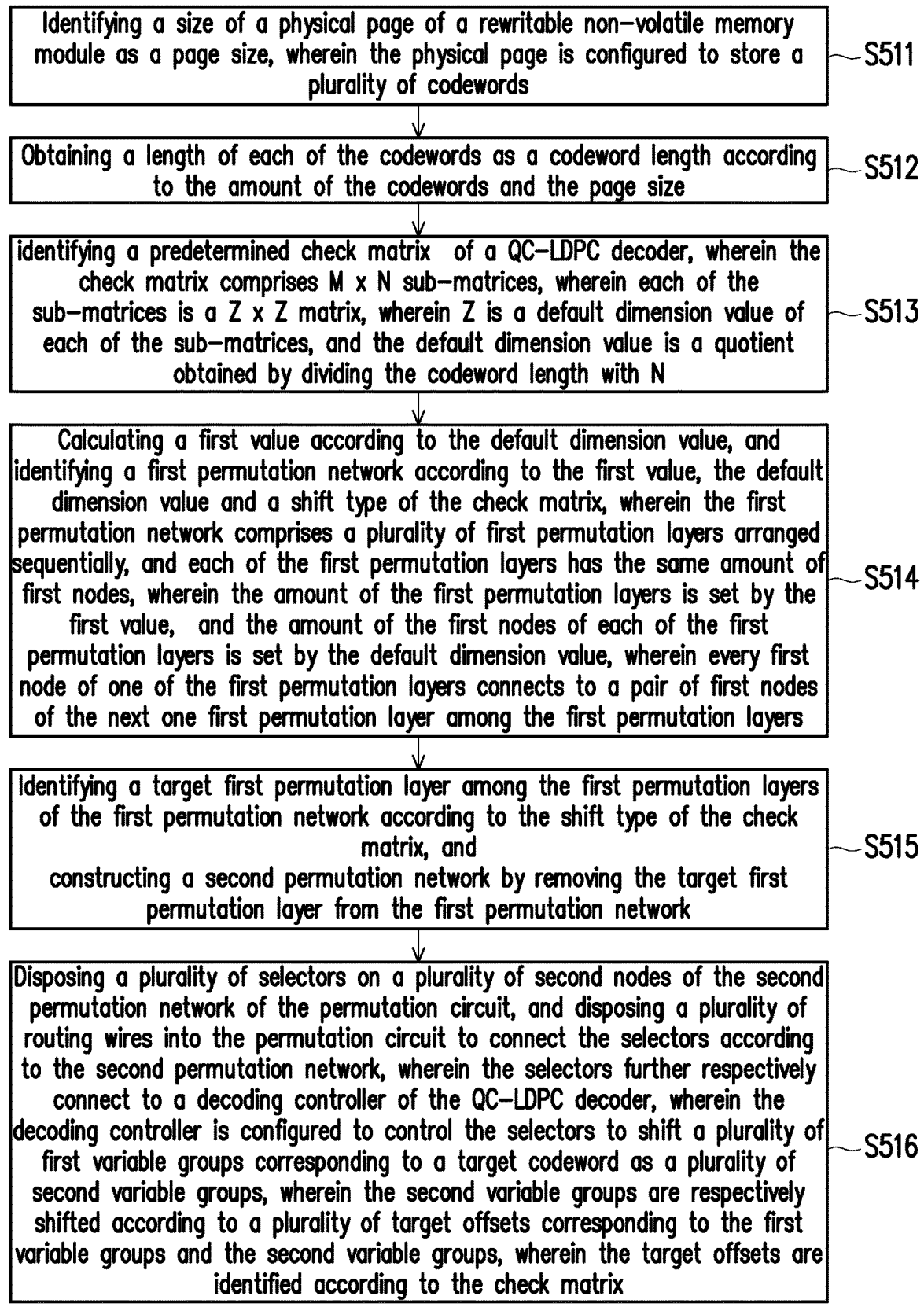
FIG. 5D is a flowchart illustrating a permutation network designing method according to an exemplary embodiment of the disclosure.

FIG. 5D is a flowchart illustrating a permutation network designing method according to an exemplary embodiment of the disclosure. Referring to FIG. 5D, in the step S511, identifying a size of a physical page of a rewritable non-volatile memory module as a page size, wherein the physical page is configured to store a plurality of codewords. Next, in the step S512, obtaining a length of each of the codewords as a codeword length according to the amount of the codewords and the page size. For example, assuming that the size of each physical page is 18432 bytes, and each of the physical page is configured to store 8 codewords. Therefore, the codeword length would be 2304 bytes (18432 bits). In other words, the size of the read target codeword comprises 18432 data bit values.

Next, in the step S513, identifying a predetermined check matrix of a QC-LDPC decoder, wherein the check matrix comprises M×N sub-matrices, wherein each of the sub-matrices is a Z×Z matrix, wherein Z is a default dimension value of each of the sub-matrices, and the default dimension value is a quotient obtained by dividing the codeword length with N. M is a predetermined value set by the manufacturer of the QC-LDPC decoder. Continue to the foregoing example, further assuming that the check matrix is a 8×72 matrix (i.e., M=8, and N=72). Therefore, the default dimension value of each of the sub-matrices of the check matrix is 8 (i.e., Z=18432/72=256).

Next, in the step S514, calculating a first value according to the default dimension value, and identifying a first permutation network according to the first value, the default dimension value and a shift type of the check matrix, wherein the first permutation network comprises a plurality of first permutation layers arranged sequentially, and each of the first permutation layers has the same amount of first nodes, wherein the amount of the first permutation layers is set by the first value, and the amount of the first nodes of each of the first permutation layers is set by the default dimension value, wherein every first node of one of the first permutation layers connects to a pair of first nodes of the next one first permutation layer among the first permutation layers.

Specifically, the first value (also referred to as "A" in the calculation formula, hereinafter) is a calculation result of $Log_2(Z)$ (e.g., the first value of the foregoing example would be $Log_2(256)=8$). In an embodiment, a second value (also referred to as "B" in the calculation formula, hereinafter) would be obtained by subtracting the first value with 1, and the second value represents the amount of all second permutation layers of the provided second permutation network, hereinafter.

Figure 5E:
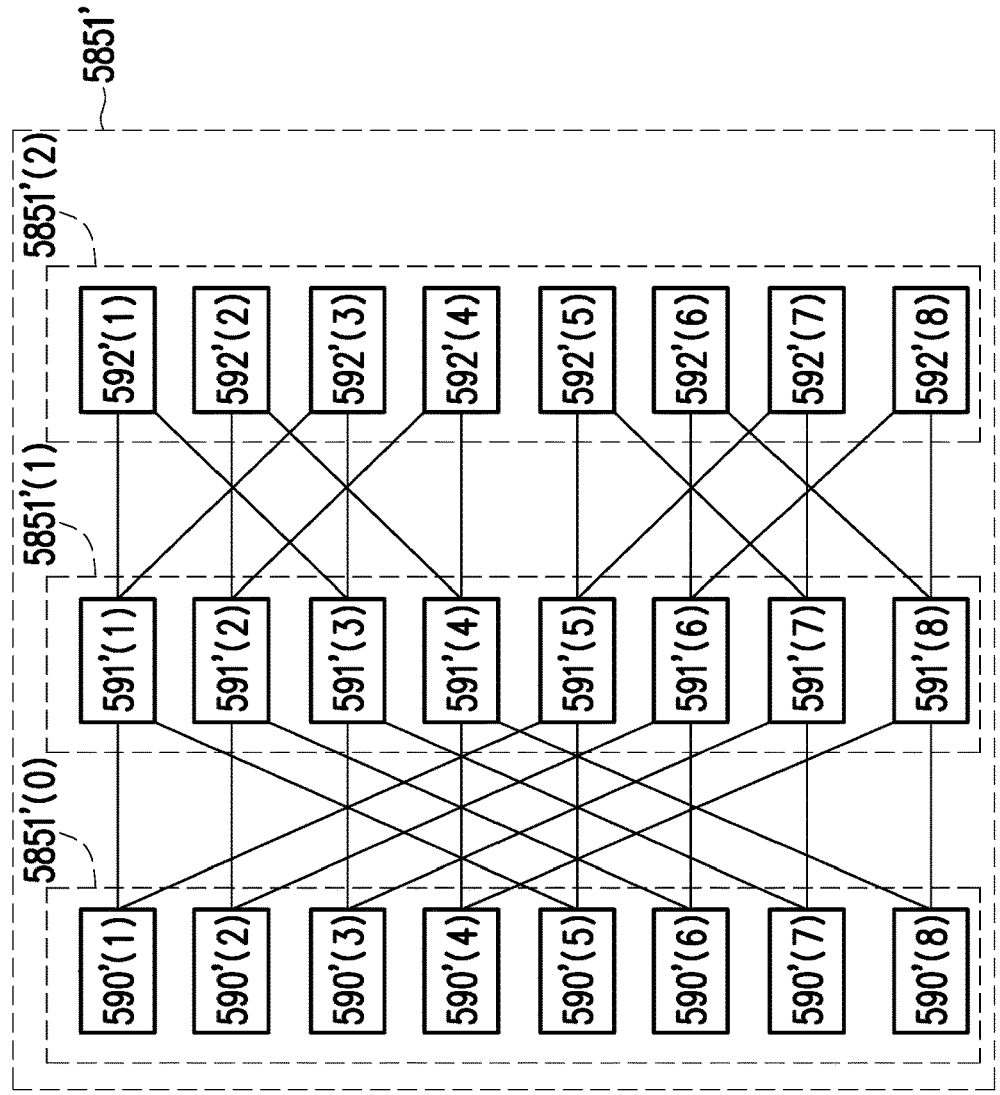
FIG. 5E is a schematic diagram illustrating a first permutation network of a permutation circuit of the decoder according to an exemplary embodiment of the disclosure.

FIG. 5E is a schematic diagram illustrating a first permutation network of a permutation circuit of the decoder according to an exemplary embodiment of the disclosure. Referring to FIG. 5E, for convenience of illustrating the architecture of a first permutation network, it assumes that the check matrix of this example in FIG. 5E is a 4×36 matrix (e.g., M=4 and N=36) having 128 sub-matrices, the codeword length is 288 bits, and the default dimension value is 8 (e.g., 288/36=8) (Step S513). Therefore, the first value would be 3 ($Log_2(8)=3$) (step S514). The amount of first permutation layers in the first permutation network is determined by the first value (equal to the first value), and the amount of the nodes of each of the first permutation layers is the same and would be set by the default dimension value (equal to the default dimension value).

For example, a first permutation network 5851' which has 3 first permutation layers 5851'(0) to 5851'(2), and each of the first permutation layers 5851'(0) to 5851'(2) has 8 first nodes (e.g., first permutation layer 5851'(0) has 8 first nodes 590'(1) to 590'(8); first permutation layer 5851'(1) has 8 first nodes 591'(1) to 591'(8); first permutation layer 5851'(2) has 8 first nodes 592'(1) to 592'(8)). It should be noted that the connection relationship between the nodes in one of the first permutation layer and the nodes in the next first permutation layer is set for connecting a input node (the node in the first one of the first permutation layers which would be connected to an input end) to several output nodes, wherein a difference between the order of the input node and the order of one of the connected output nodes may be characterized into one of three kinds shift types, the three kinds shift types includes a normal shift type, an even shift type and an odd shift type. For example, taking the first node 590'(1) for example, the first node 590'(1) is an input node in the first permutation network, the order of the input node 590'(1) is "1", the first node 590'(1) connects to 4 output nodes 592'(1), 592'(3), 592'(5) and 592'(7), wherein the order of the output node 592'(1) is "1"; the order of the output node 592'(3) is "3"; the order of the output node 592'(5) is "5"; the order of the output node 592'(7) is "7". The difference between the order of the input node 590'(1) and the order of the output node 592'(1) is 0; the difference between the order of the input node 590'(1) and the order of the output node 592'(3) is 2; the difference between the order of the input node 590'(1) and the order of the output node 592'(5) is 4; the difference between the order of the input node 590'(1) and the order of the output node 592'(7) is 6.

In other words, the differences between the order of one input node 590'(1) and the orders of the connected output nodes 592'(1), 592'(3), 592'(5) and 592'(7) are all even values (i.e., 0, 2, 4, 6), and thus, in this example, the difference between the order of the input node and the order of one of the connected output nodes may be characterized into an even shift types. Therefore, the first permutation network 5851' would be identified as a first permutation network corresponding to an even shift type check matrix of the QC-LDPC decoder. Furthermore, a first permutation network which would be identified as corresponding to the "odd" shift type check matrix in the similar way, and the detail would be omitted hereto. In addition, in another first permutation network, if the differences between the order of one input node and the orders of the connected output nodes may form a sequence like "0, 1, 2, . . . , Z", this first permutation would be identified as corresponding to the normal shift type check matrix. The detail about different shift type check matrices would be explained with the reference of FIGS. 14A and 14B below.

Moreover, it should be noted that, as illustrated by FIG. 5E, every first node of one of the first permutation layer connects to a pair of first nodes in the next first permutation layer. For example, since first permutation layer 5851'(1) is arranged after the first permutation layer 5851'(0) (first permutation layer 5851'(1) is the next one of first permutation layer of the first permutation layer 5851'(0)), first node 590'(1) connects to a pair of first nodes 591'(1) and 591'(5); first node 590'(2) connects to a pair of first nodes 591'(2) and 591'(6); first node 590'(3) connects to a pair of first nodes 591'(3) and 591'(7); first node 590'(4) connects to a pair of first nodes 591'(4) and 591'(8); first node 590'(5) connects to a pair of first nodes 591'(1) and 591'(5); first node 590'(6) connects to a pair of first nodes 591'(2) and 591'(6); first node 590'(7) connects to a pair of first nodes 591'(3) and 591'(7); first node 590'(8) connects to a pair of first nodes 591'(4) and 591'(8). The bit value(s) of a variable inputted to a first node of one first permutation layer would be inputted (transmitted) to a selected one first node of the pair of the first nodes in the next one permutation layer connecting to that said first node. For example, a bit inputted into the first node 590'(1) would be transmitted to first node 591'(1) or first node 591'(5) according to a selecting instruction issued on the first node 590'(1) by the decoding controller 581.

Next, in the step S515, identifying a target first permutation layer among the first permutation layers of the first permutation network according to the shift type of the check matrix, and constructing a second permutation network by removing the target first permutation layer from the first permutation network.

Figure 5F:
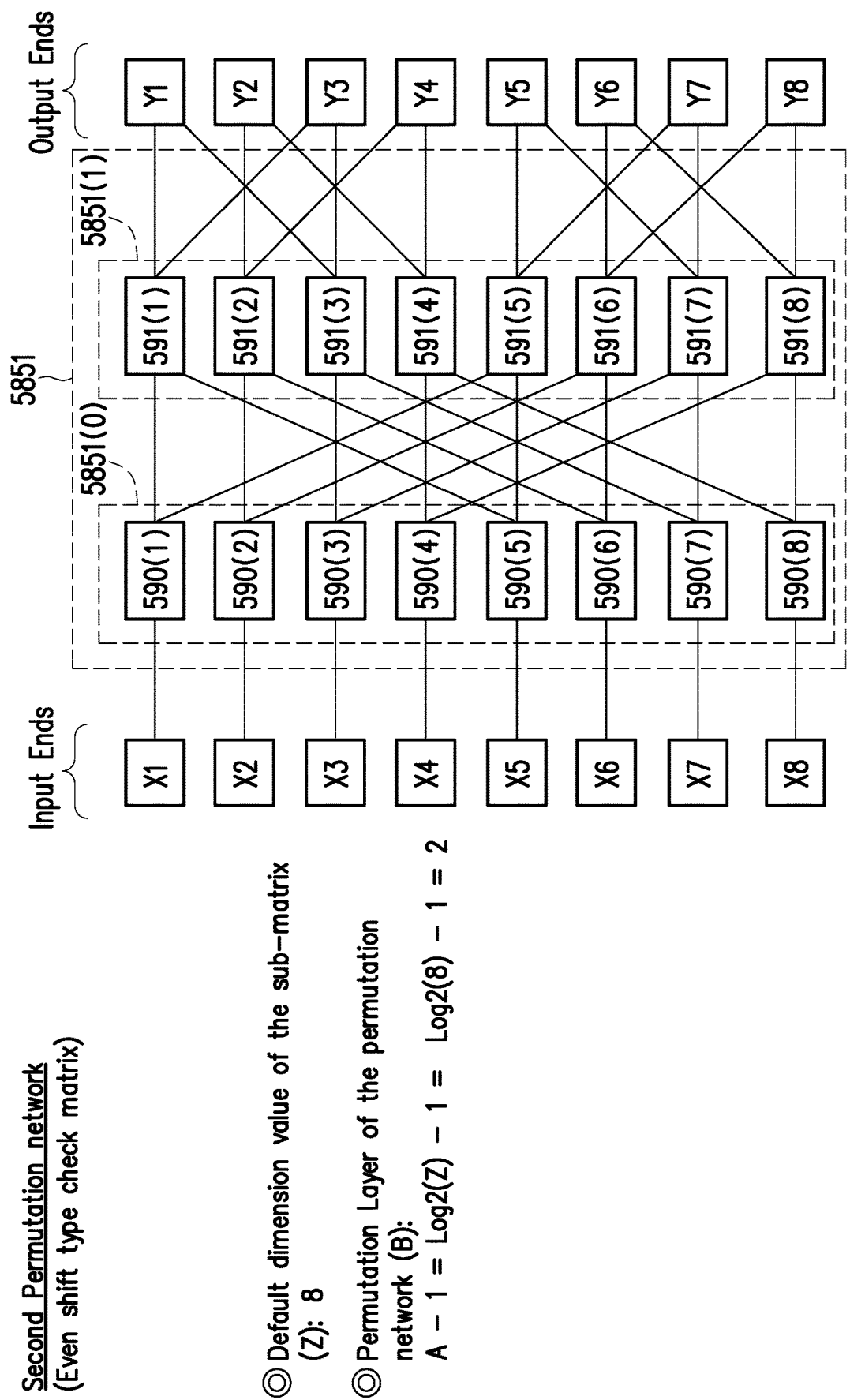
FIG. 5F is a schematic diagram illustrating a second permutation network of a permutation circuit of the decoder according to an exemplary embodiment of the disclosure.

FIG. 5E is a schematic diagram illustrating a permutation network of a permutation circuit of the decoder according to an exemplary embodiment of the disclosure. For example, referring to FIG. 5E, in the present embodiment, a target layer (also referred to as target first permutation layer) among all the first permutation layers of the first permutation network would be identified according to the shift type of the check matrix. In more detail, it is assumed that the check matrix is the even type in this case, and the last one (5851'(2)) of the first permutation layers would be identified as the target first permutation layer. Then, for constructing the second permutation network, the identified target first permutation layer would be removed from the first permutation network. In other words, after removing the target first permutation layer 5851'(2) from the first permutation network 5851, the remaining first permutation layers 5851'(0) to 5851'(1) of the original first permutation network 5851' would become the second permutation layers 5851(0) and 5851 (1), so as to form the second permutation network 5851 (as illustrated in FIG. 5F). And, in the permutation circuit 585 containing the second permutation network 5851, the output ends Y1 to Y8 would substitute the target first permutation layer 5851'(2) to connect to the second permutation layer 5851'(1) according to the connection relationship between the first nodes in the first permutation layer 5851'(1) and the first nodes in the target first permutation layer 5851'(2).

FIG. 5F is a schematic diagram illustrating a second permutation network of a permutation circuit of the decoder according to an exemplary embodiment of the disclosure. Referring to FIG. 5F, the constructed second permutation network 5851 includes 2 (e.g., the second value(B) is 2) second permutation layers 5851(0) (converted from the first permutation layer 5851'(0)) and 5851(1) (converted from the first permutation layer 5851'(1)), wherein 8 (e.g., default dimension value is 8) second nodes 590(1) to 590(8) (converted from the first nodes 590'(1) to 590'(8)) are set on the second permutation layer 5851(0), and another 8 second nodes 591(1) to 591(8) (converted from the first nodes 591'(1) to 591'(8)) are set on the permutation layer 5851(1).

Referring back to FIG. 5D, next, in the step S516, disposing a plurality of selectors on a plurality of second nodes of the second permutation network of the permutation circuit, and disposing a plurality of routing wires into the permutation circuit to connect the selectors according to the second permutation network, wherein the selectors further respectively connect to a decoding controller of the QC-LDPC decoder, wherein the decoding controller is configured to control the selectors to shift a plurality of first variable groups corresponding to a target codeword as a plurality of second variable groups, wherein the second variable groups are respectively shifted according to a plurality of target offsets corresponding to the first variable groups and the second variable groups, wherein the target offsets are identified according to the check matrix.

Specifically, the provided permutation circuit is formed by the constructed second permutation network, not by the first permutation network. The constructed second permutation network would be arranged between a plurality of input ends and a plurality of output ends in the permutation circuit. In more detail, each of the second nodes of the first one of the second permutation layers of the second permutation network connects to a plurality of input ends of the permutation circuit, and each of the second nodes of the last one of the second permutation layers of the permutation network connects to two of a plurality of output ends of the permutation circuit.

Figure 5G:
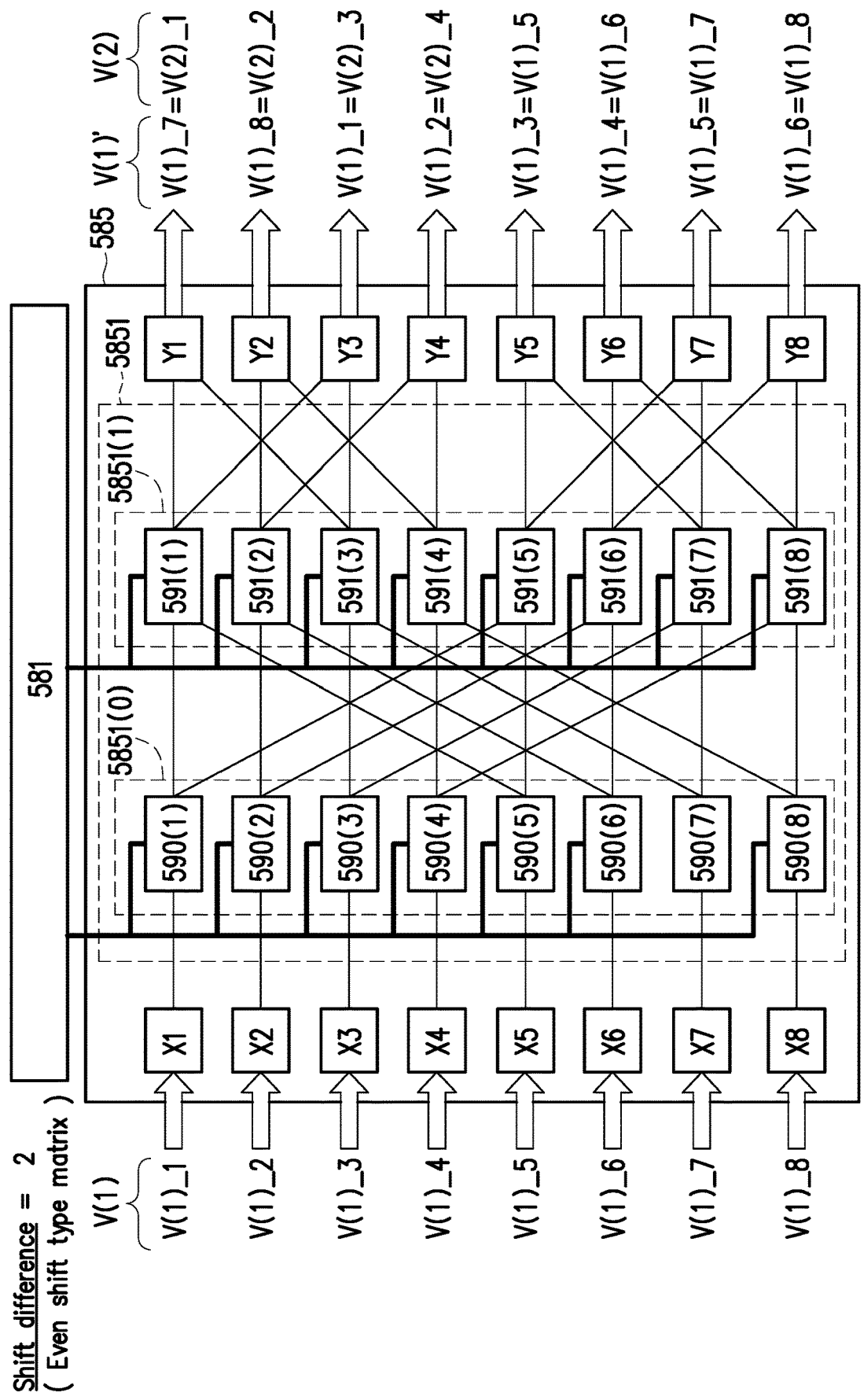
FIG. 5G is a schematic diagram illustrating the permutation circuit of the decoder according to an exemplary embodiment of the disclosure.

FIG. 5G is a schematic diagram illustrating the permutation circuit of the decoder according to an exemplary embodiment of the disclosure.

Referring to FIG. 5G, continuing to the example in FIG. 5F, the permutation network 5851 is arranged between a plurality of input ends X1 to X8 and a plurality of output ends Y1 to Y8. For example, as illustrated by FIG. 5G, the second permutation layer 5851(0) is the first one of the second permutation layers 5851(0) to 5851(1) of the permutation network 5851, and the second permutation layer 5851(1) is the last one of the second permutation layers 5851(0) to 5851(1) of the permutation network 5851. Second node 590(1) to 590(8) are respectively connected to the input ends X1 to X 8, second node 591(1) is connected to output ends Y1 and Y3; second node 591(2) is connected to output ends Y2 and Y4; second node 591(3) is connected to output ends Y1 and Y3; second node 591(4) is connected to output ends Y2 and Y4; second node 591(5) is connected to output ends Y5 and Y7; second node 591(6) is connected to output ends Y6 and Y8; second node 591(7) is connected to output ends Y7 and Y5; second node 591(8) is connected to output ends Y6 and Y8.

Furthermore, in the present embodiment, the main hardware elements of the permutation circuit, the selectors, would be disposed into the permutation circuit according to the constructed permutation network architecture. Firstly, the amount of the set of selectors on one node would be determined according to a characteristic of the variable. Specifically, a set of selectors are disposed on each of the nodes of the permutation network, and the amount of each set of the selectors on each of the nodes is determined by a preset fineness value related to the variables. Specifically, as mentioned before, the preset fineness value is used to set the amount of the bits corresponding to a variable. When a variable is inputted into one node, a set of selectors on this one node would transmit (shift) every bit of this inputted variable to another set of selectors on another node of the next permutation layer, and thus, the amount of a set of selectors on one node needs to be equal to the amount of the bits of one variable (i.e., the amount of selectors on one node is set to be equal to the preset fineness value). Therefore, the total amount of all the selectors in all the nodes of the permutation network of the permutation circuit can be determined according to the default dimension value, the preset fineness value, and the second value. In more detail, the total amount of all the selectors in all the nodes of the permutation network of the permutation circuit is set by a calculation result of (Z*B*F), wherein Z is the default dimension value, B is the amount of the second permutation layers (i.e., second value), and F is the preset fineness value.

On the other hand, the routing wires configured to connect to the hardware elements in the permutation circuit play another important role, and the amount of the routing wires would be determined by the amount of selectors in every permutation layer of the permutation network.

Figure 17:
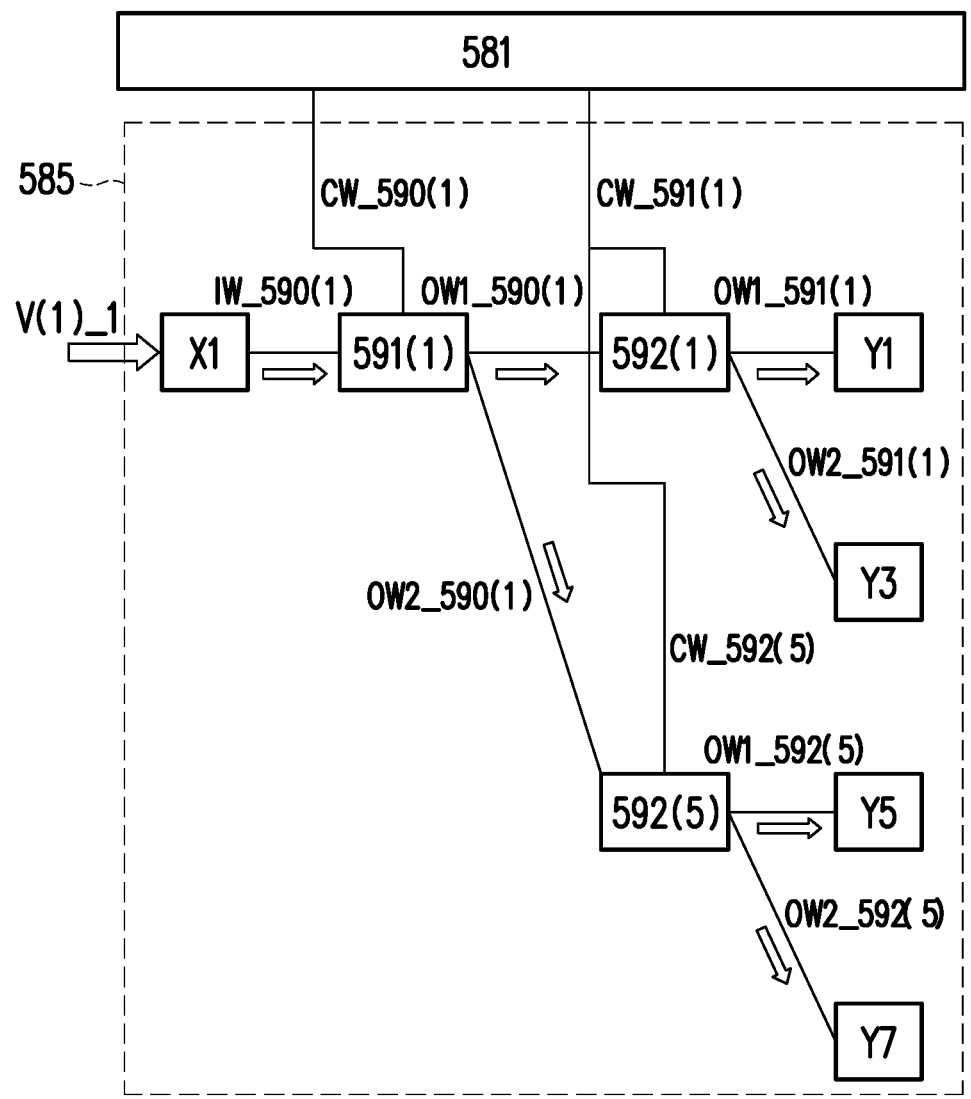
FIG. 17 is a schematic diagram illustrating a connecting relationship of a plurality of selectors and the routing wires connecting to the selectors in the provided second permutation network of the permutation circuit according to an exemplary embodiment of the disclosure.

FIG. 17 is a schematic diagram illustrating a connecting relationship of a plurality of selectors and the routing wires connecting to the selectors in the provided second permutation network of the permutation circuit according to an exemplary embodiment of the disclosure.

Referring to FIG. 17, taking a part of the second permutation network 5851 for the example, for each of the selectors on the second nodes of the second permutation layer 5851(0) of the permutation network 5851, the selector (e.g., a selector on node 590(1)) of the first one of the second permutation layers needs total four routing wires, including: (1) one routing wire (e.g., routing wire IW_590(1)) for connecting input end X1 and that said selector on the node 590(1); (2) one routing wire (e.g., routing wire CW_590(1)) for connecting decoding controller 581 and that said selector on the node 590(1); (3) two routing wires (e.g., routing wire OW1_590(1) and OW2_590(1)) for respectively connecting that said selector on the node 590(1) to two selectors on respective two nodes 591(1) and 591(5).

Furthermore, for each of the selectors on the second nodes of the rest (e.g., permutation layer 5851(1)) of second permutation layers other than the first one of the second permutation layers of the permutation network 5851, the selector (e.g., selector on second node 591(1)) of this other second permutation layer needs total three routing wires, including: (1) one routing wire (e.g., routing wire CW_591(1)) for connecting decoding controller 581 and that said selector on the second node 591(1); (2) two routing wires (e.g., routing wire OW1_591(1) and OW2_591(1)) for respectively connecting that said selector on the second node 591(1) to two output ends Y1 and Y3 of the permutation circuit (note: respectively to two selectors of two nodes on a second permutation layer next to the permutation layer 5851(1) if there exists one second permutation layer arranged after the permutation layer 5851(1)).

In short, the amount of routing wires connecting to every selector in the first one of the second permutation layers of the permutation network is 4, the amount of routing wires connecting to every selector in the rest of the second permutation layers of the permutation network is 3. In the present embodiment, the amount of all the routing wires for connecting all the selectors in the permutation circuit is determined according to the amount of the selectors in the first one of the second permutation layers and the amount of the selectors in the other second permutation layer(s). In other words, the amount of all the routing wires corresponding to all the selectors of the second permutation network is calculated according to the default dimension value, the preset fineness value, and the amount of all second permutation layers (second value). In more detail, the amount of all the routing wires is set by a calculation result of ($Z*F+3*T$), and T is the amount of all the selectors of the second permutation network (i.e., $T=Z*B*F$).

Taking the whole permutation circuit 585 in FIG. 5G for the example, where the total amount of the bits of an inputted variable (Preset Fineness value, F)=5; the default dimension value of the sub-matrix (Z)=8; and the amount of the second permutation layers (Second value, B)=2. The amount of all the selectors of the second permutation network 5851 would be determined by ($Z*B*F$) of which the result is 80 (i.e., T=80); and the amount (also referred to as "W" hereinafter) of all the routing wires of all the selectors would be determined by ($Z*F+3*T$) of which the result is 240.

In the present embodiment, after the amount (T) of all the selectors of the permutation circuit, the amount (W) of all the corresponding routing wires of the permutation circuit, and the connecting relationship (e.g., the connection implemented by the routing wires) between the selectors, decoding controller, input ends and output ends are determined (or identified according to the connection relationship of the remaining first permutation layers of the identified first permutation network), T selectors and W routing wires would be disposed into the permutation circuit according to the constructed second permutation network, such that the design of the permutation circuit is completed.

It should be mentioned that the selectors, for example, is a basic switch which has one input terminal, two output terminals, and one control terminal. The control terminal is electrical coupled to the decoding controller, so as to receive the selecting instruction (also referred to as selecting signal) from the decoding controller, wherein the selector may connect the input terminal to one of two output terminals according to the selecting instruction, such that a bit inputted into the input terminal would be outputted from one of the two output terminals selected by the selecting instruction. The input terminal of a selector is electrically coupled to an input end of the permutation circuit via the routing wire or coupled to an output terminal of a selector in a permutation layer arranged before the permutation layer to which the selector belongs via the routing wire. The two output terminals of a selector are electrically coupled to two output ends of the permutation circuit via the routing wires, or respectively coupled to an output terminal of two selectors on different nodes in the next permutation layer via the routing wire.

Furthermore, as mentioned above, the decoding controller 581 is further configured to control the selectors to shift a plurality of first variable groups corresponding to a target codeword as a plurality of second variable groups by issuing selecting instruction to the selectors, and the steps of "shift a plurality of first variable groups corresponding to a target codeword as a plurality of second variable groups" comprises steps (1) to (3) below.

Step (1), inputting, by the decoding controller, respectively all the variables in one of the first variable groups into different input ends, wherein all the inputted variables are transmitted respectively to all the nodes of the first one permutation layers by all the input ends;

Next, in Step (2), shifting, by the selectors in the permutation network, all inputted variables by one shift difference corresponding to the one of the first variable groups.

Next, in Step (3), outputting respectively all shifted variables from different output ends as a second variable group corresponding to the one of the first variable groups, wherein all the shifted variables are transmitted respectively by selectors on all the nodes of the last one permutation layers to the output ends, wherein the one shift difference is determined by a difference between a first target offset corresponding to the one of the first variable groups and a second target offset corresponding to the second variable group, wherein the first target offset is identified according a first sub-matrix corresponding to the one of first variable group among the sub-matrices of the predetermined check matrix, and the second target offset is identified according to a second sub-matrix corresponding to the second variable group among the sub-matrices of the predetermined check matrix.

For example, referring back to FIG. 5G, for example, in the present embodiment, the variable group V(1) which is inputted, by the decoding controller, into input ends X1 to X8 of the permutation circuit 585 is referred to as the first variable group, the variables V(1)_1 to V(1)_8 of the first variable group V(1) are arranged in a predetermined order (e.g., variable V(1)_1 is the first one variable, and variable V(1)_8 is the last one variable, as illustrated in FIG. 5G), and the variables V(1)_1 to V(1)_8 are respectively inputted into the input ends X1 to X8 according to their predetermined order (Step 1). The input ends X1 to X8 transmit the variables V(1)_1 to V(1)_8 to the first one permutation layer 5851(1) of the permutation circuit 585. Furthermore, the variable group V(1)' which is shifted from the inputted first variable group V(1) by the permutation circuit 585 according to the shift difference "2" (Step 2) and outputted from the output ends Y1 to Y8, wherein, with the predetermined order (also the order of the ends X1 to X8 or Y1 to Y8), variables V(1)_7 to V(1)_6 of the shifted variable group V(1)' are outputted from the output ends Y1 to Y8 (Step 3). The shifted variable group V1(1)' may be referred to as the second variable group V(2) having the variables V(2)_1 to V(2)_8 arranged according to the predetermined order, wherein the variables V(2)_1 to V(2)_8 actually are equal to the variables V(1)_7 to V(1)_6 of the shifted variable group V(1)'. It should be noted that V(1)_1 inputted into the input end X1 which has the predetermined order "1" is outputted from the output end Y3 which has the predetermined order "3". In other words, the bit V(1)_1 is shifted from order "1" to order "3", i.e., the bit V(1) is shifted by "2" shift difference. Below will explain more detail about the shift difference and the shift type of the check matrix with the references of FIGS. 14A and 14B.

Figure 14A:
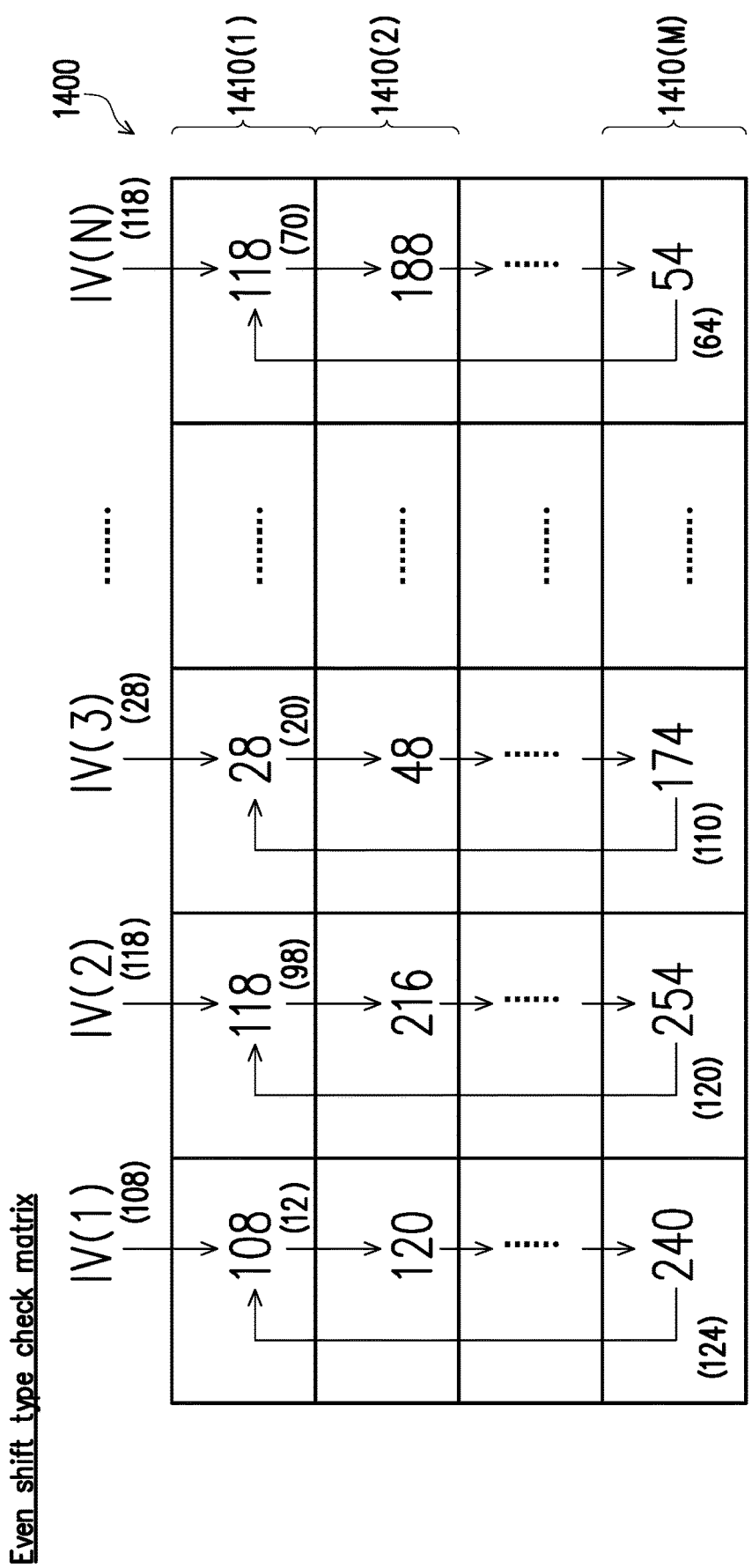
FIG. 14A is a schematic diagram illustrating the shifting of the variable groups performed by a permutation circuit having the provided second permutation network corresponding to an even shift type check matrix according to an exemplary embodiment of the disclosure.
Figure 14B:
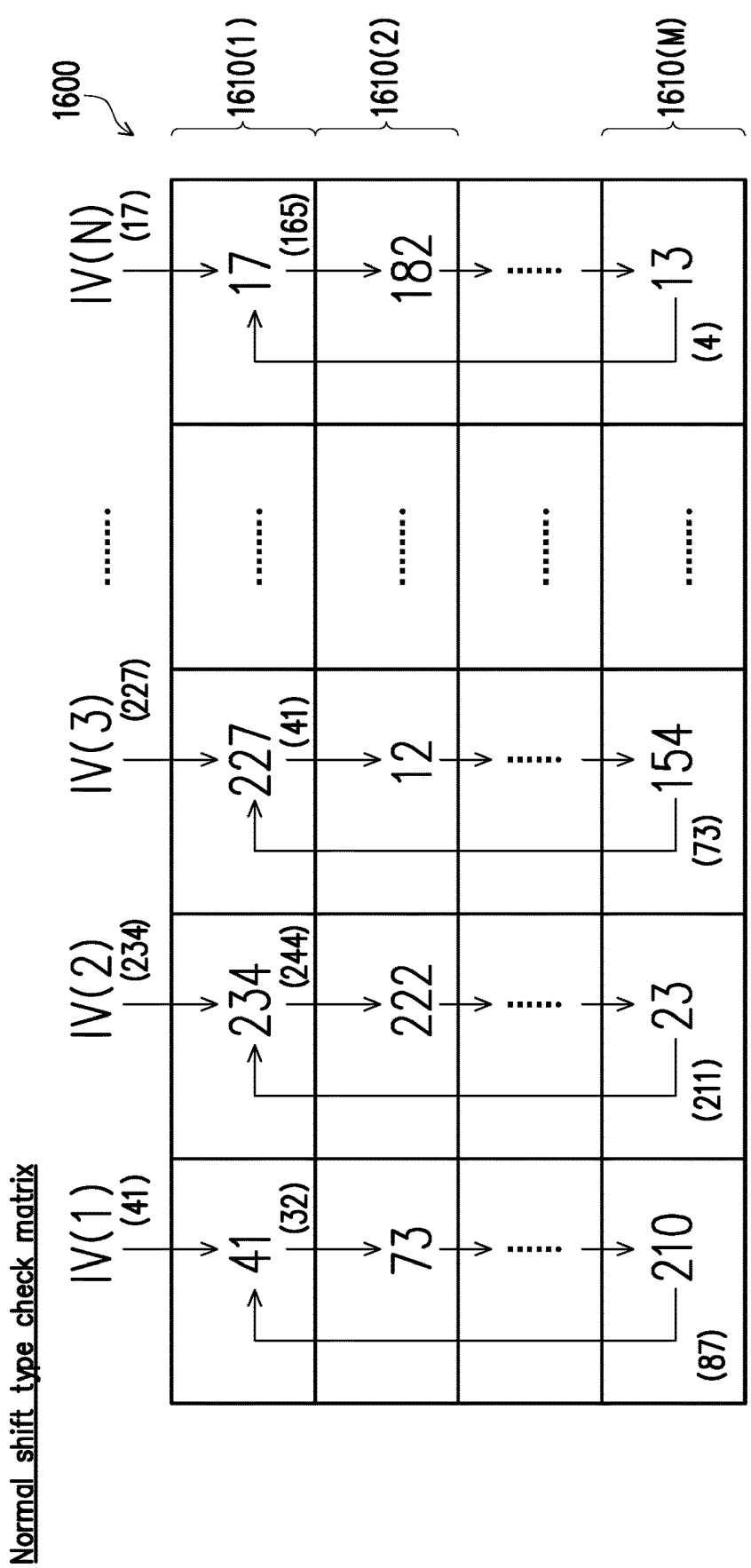
FIG. 14B is a schematic diagram illustrating the shifting of the variable groups performed by a permutation circuit having a conventional permutation network corresponding to a normal shift type check matrix of a prior art.

FIG. 14A is a schematic diagram illustrating the shifting of the variable groups performed by a permutation circuit having the provided second permutation network corresponding to an even shift type check matrix according to an exemplary embodiment of the disclosure. FIG. 14B is a schematic diagram illustrating the shifting of the variable groups performed by a permutation circuit having a conventional permutation network corresponding to a normal shift type check matrix of a prior art.

Referring to FIG. 14A, it is assumed that all variables in the initial variable groups IV(1) to IV(N) are obtained, by the decoding controller 581, by looking-up the decoding table according to the data bit values of the target codeword. Furthermore, it is assumed that a check matrix 1400 (which is a M×N matrix) includes sub-matrix groups (also referred to as sub-matrix layers) 1410(1) to 1410(M). However, the disclosure is not limited hereto, for example, in an embodiment, the all "1" among the data bit values of the target codeword convert to "−Q" as a variable, and all "0" among the data bit values of the target codeword convert to "Q" as a variable, wherein Q is a predetermine parameter value, so as to obtained a plurality of converted data bit values as the variables.

Each of the sub-matrix groups 1410(1) to 1410(M) includes N sub-matrices. In FIG. 14, each block represents a sub-matrix, and the default dimension value of each sub-matrix is 256 (i.e., each of the sub-matrices is a 256×256 matrix). In FIG. 14A, a value in each sub-matrix (i.e., each block) refers to a target offset of a variable group corresponding to each sub-matrix. For example, values 108, 118, 28, . . . and 118 marked in the first to the fifth sub-matrices in the sub-matrix group 1410(1) represent that the target offsets of a plurality of second variable groups which is shifted from the initial first variable groups IV(1) to IV(N). For example, the variable group having target offset "216" is the variable group obtained by shifting the initial variable group IV(2) by an offset "216" (target offset "216" is a offset from IV(2)). Furthermore, the variable group having target offset "216" may be obtained by shifting a shifted variable group having target offset "118" (target offset "118" is a offset from IV(2) by a shift difference "98" since the shifted variable group having target offset "118" is already be shifted by an offset "118" (216−118=98).

In other words, the target offsets of the same column of the check matrix indicates the offsets by which the shifted variable groups corresponding to the sub-matrices in the same column are shifted from the same initial variable group of the same column. For example, the shifted variable groups of target offset "108", "120", . . . , "240" are shifted from the same initial variable group IV(1) of the first one column of the check matrix by offsets "108", "120", . . . , "240".

In the present embodiment, the target offset of the initial variable group is preset to 0. A shift difference is the value obtained by modulo the difference (the difference is calculated by subtracting the target offset (also referred to as the second target offset) of the second variable group with the target offset (also referred to as the first target offset) of the first variable group) with a permutation network size (also called as the default dimension value, i.e., Z). For example, the "(124)" is obtained by modulo (operator "mod") a difference value with 256, wherein the difference value is obtained by subtracting 109 with 241, i.e., −132, and the result of modulo −132 with 256 (−132 mod 256) is 124.

The arrow mark "→" in FIG. 14A indicates the direction of the shifting, and the number in the mark "( )" on the arrow mark indicates the shift difference between a first target offset and a second target offset. For example, "IV(1)→108" means that all variables in the initial variable group is shifted by a shift difference(offset) "108" to become a second variable group of which the second target offset is "108"; "108→120" means that all variables in the variable group of which the first target offset is "108" is shifted by a shift difference "12" to become a second variable group of which the second target offset is "120". It should be mentioned that the decoding controller 581 issues the selecting instructions (selecting signals) to the selectors according to the shift difference determined by the target offsets of the corresponding sub-matrices, such that the whole selectors in the permutation circuit 585 may shift the inputted first variable group by the shift difference to output the second variable group.

In the present embodiment, all the values of the target offsets corresponding to every sub-matrix of the check matrix are set by predetermining (designing) the check matrix used by the QC-LDPC decoder. Specifically, each of the target offsets is set within a permutation network size range, wherein the permutation network size range is set as 0 to Z−1. Furthermore, the shift difference is set by a rule that the shift difference between two corresponding target offsets is set within a permutation network shift range, and each of all the shift differences is determined according the shift type of the check matrix.

In more detail, if the check matrix is an even shift type check matrix, each of all the shift differences are set as an even value within a range of 0 to (Z−1). For example, referring to FIG. 14A again, each of the target offsets corresponding to all sub-matrices of the check matrix is a value within the permutation network size range (i.e., 0 to 255), and each of the corresponding shift differences is an "even" value within the permutation network shift range (i.e., an even value within 0 to 255). However, other features for designing the check matrix are not the main concept of the disclosure, and the corresponding details are omitted hereto. In some embodiment, the target offset corresponding to several sub-matrices among all sub-matrices of a check matrix would be set as null value (e.g., the corresponding shift difference would be 0).

Similarly, if the check matrix is an odd shift type matrix, each of the target offsets corresponding to all sub-matrices of the check matrix is a value within the permutation network size range (i.e., 0 to Z−1), and each of the corresponding shift differences is an "odd" value within the permutation network shift range (i.e., an even value within 0 to (Z−1)).

It should be mentioned that if all the shift differences corresponding to the check matrix are even, the shift type of the check matrix is an even shift type, and the target first permutation layer is the last one of the first permutation layers of the identified first permutation network corresponding to the even shift type check matrix; if all the shift differences corresponding to the check matrix are odd, the shift type of the check matrix is an odd shift type, and the target first permutation layer is the last one of the first permutation layers of the identified first permutation network corresponding to the odd shift type check matrix.

Referring to FIG. 14B, if the check matrix is a normal shift type matrix as the conventional check matrix designed by the prior art, each of the target offsets corresponding to all sub-matrices of the check matrix is a value within the permutation network size range (i.e., 0 to Z−1), and each of the corresponding shift differences is a value (any integer) within the permutation network shift range (i.e., an even value within 0 to (Z−1)), as illustrated in FIG. 14B, and the shift differences are not only even values (even shift type) or only odd values (odd shift type).

In addition, referring to FIG. 14A, after the shifting order is left to right, up to down. For example, the first group shifting operation is performed on initial variable group IV(1) by the permutation circuit according to the shift difference "108", so as to obtain the corresponding second variable group having second target offset "108"; next, initial variable group IV(2) is shifted by the permutation circuit according to the shift difference "118", so as to obtain the corresponding second variable group having second target offset "118", and so on, such that the (second) variable groups having target offsets 108, 118, 28, . . . , 118 corresponding to the sub-matrix group 1410(1) are obtained from the (first) initial variable groups having target offsets 0, 0, 0, . . . , 0. Then, the variable groups corresponding to the sub-matrix group 1410(2) would be shifted from the variable groups corresponding to the sub-matrix group 1410(1) in the same manner, and so on, such that all the variable groups corresponding to all sub-matrices are obtained. In another aspect, the variable groups corresponding to the first column sub-matrices of the check matrix are shifted from the initial variable group IV(1), the variable groups corresponding to the second column sub-matrices of the check matrix are shifted from the initial variable group IV(2), etc.

The improvement of the provided permutation network designing method and the permutation circuit using the same would be explained below with the references of FIGS. 15, 16A, 16B and 16C.

Figure 15:
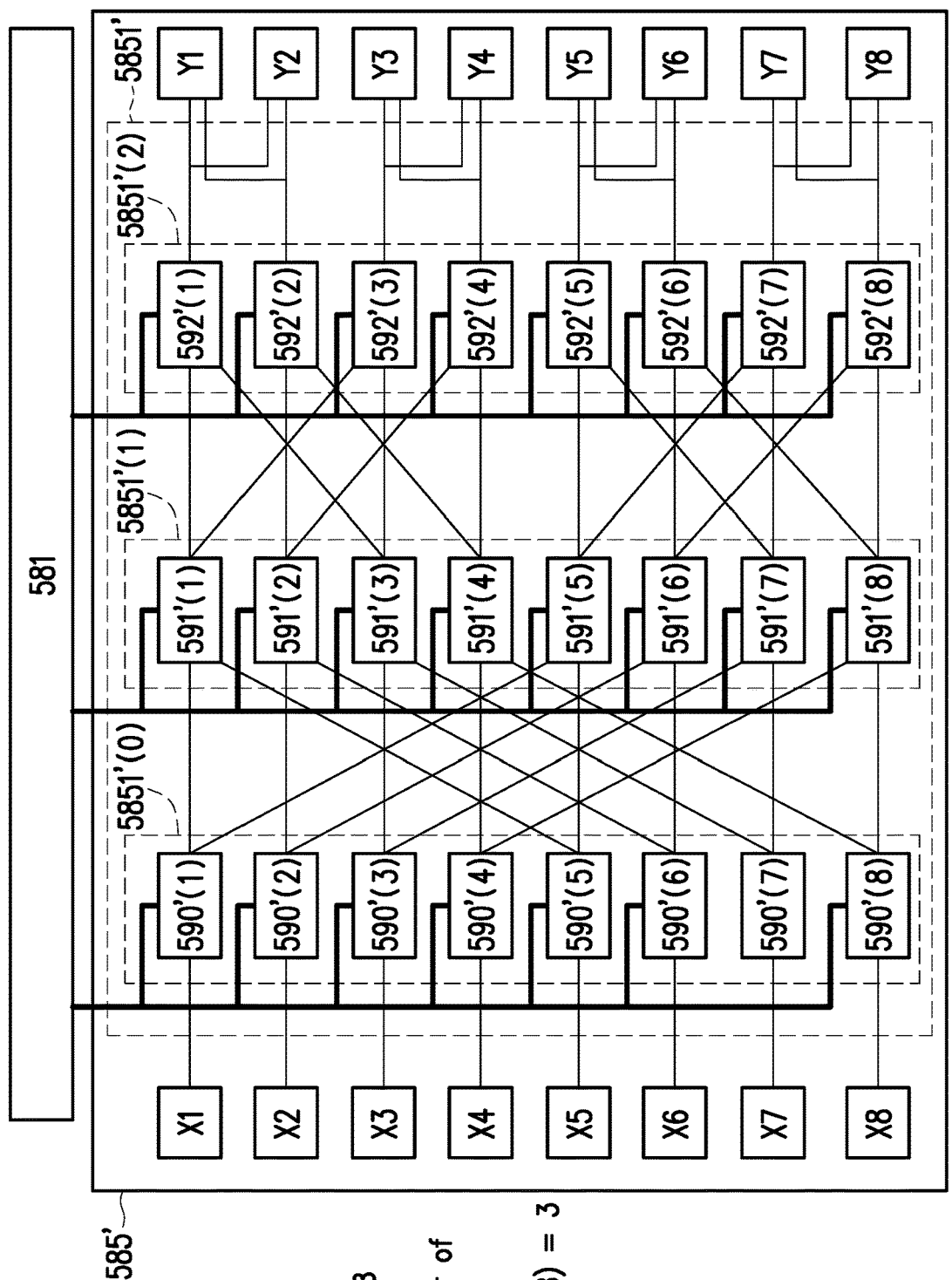
FIG. 15 is a schematic diagram illustrating the conventional permutation circuit of the decoder according to a prior art.

FIG. 15 is a schematic diagram illustrating the conventional permutation circuit of the decoder according to a prior art. Referring to FIG. 15, the difference between the provided permutation circuit 585 in FIG. 5G and the conventional permutation circuit 585' in FIG. 15 is the architecture of the permutation network thereof. For example, as illustrated by FIG. 15, the permutation network of the conventional permutation circuit may be a first permutation network without removing the target first permutation layer. For example, the permutation layer 5851'(0) is the first one permutation layer of the permutation network 5851', and the permutation layer 5851'(3) is the last one permutation layer of the permutation network 5851. Nodes 590'(1) to 590'(8) are respectively connected to the input ends X1 to X 8, nodes 592'(1) is connected to output ends Y1 and Y2; nodes 592'(2) is connected to output ends Y1 and Y2; nodes 592'(3) is connected to output ends Y3 and Y4; nodes 592'(4) is connected to output ends Y3 and Y4; nodes 592'(5) is connected to output ends Y5 and Y6; nodes 592'(6) is connected to output ends Y5 and Y6; nodes 592'(7) is connected to output ends Y7 and Y8; nodes 592'(8) is connected to output ends Y7 and Y8.

In other words, the difference between the permutation network architectures 5851 and 5851' is the amount of the permutation layers. In the prior art, the amount of the permutation layers of the permutation network 5851' is set by the first value, but the amount of the permutation layers of the provided permutation circuit is second value (i.e., first value minus 1). In other words, the amount of the permutation layers of the permutation network 5851 is less than the amount of the permutation layers of the conventional permutation network by 1.

Since the provided permutation network has less number of the permutation layers, the amount of all the selectors on the nodes of all the permutation layers would be decreased accordingly, and the corresponding routing wires connecting to all selectors would be decreased, too. Therefore, the hardware cost for all the selectors and routing wires would be drastically decreased, and the difficulty for disposing the routing wires would be also decreased with the less routing wires (Also, the whole hardware size of the permutation circuit would be decreased). Furthermore, the power consumption would be decreased, too, since the selectors for performing the shifting operation are decreased and the total routing path of all the routing wires is also decreased, the power need to be supplied for performing the whole shifting operation would be decreased, such that the power consumption of the permutation circuit would be decreased accordingly. In addition, the corresponding heat generation would be decreased, so as to decrease the processing temperature of the permutation circuit.

Figures 16A, 16B:
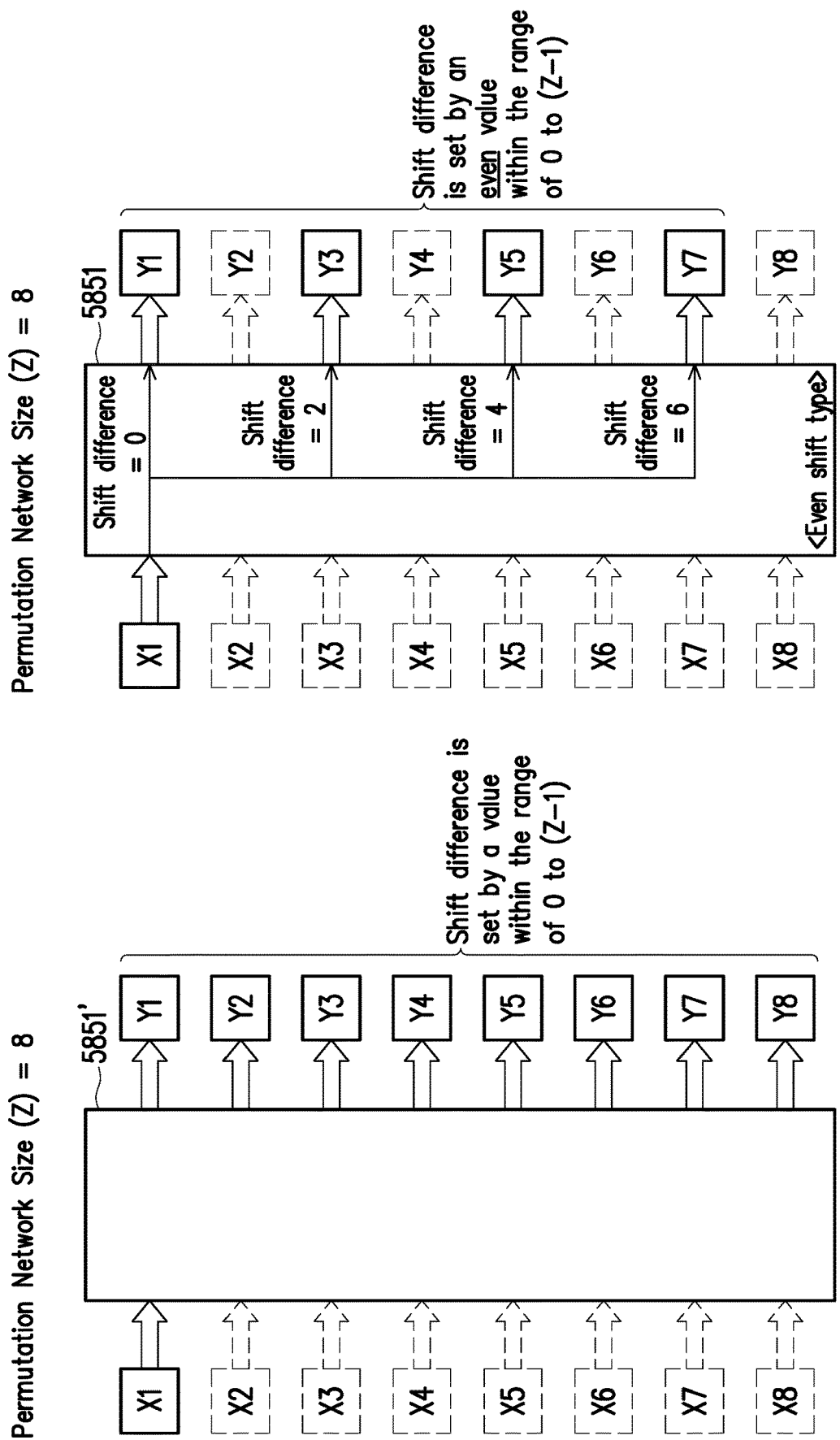
FIG. 16A is a schematic diagram illustrating a conventional permutation network shift range corresponding to a normal type check matrix of a prior art.
FIG. 16B is a schematic diagram illustrating a provided permutation network shift range corresponding to an even type check matrix according to an exemplary embodiment of the disclosure.
Figure 16C:
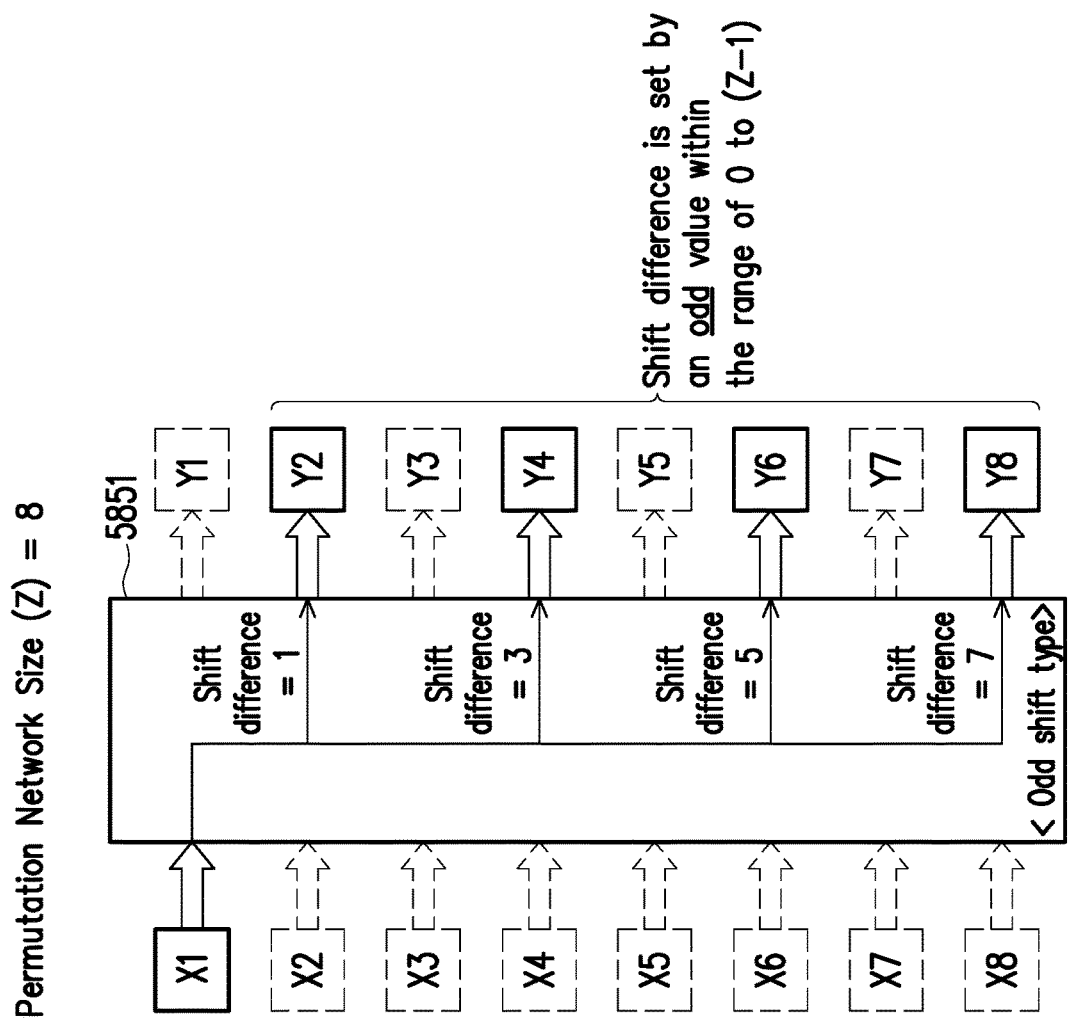
FIG. 16C is a schematic diagram illustrating a provided permutation network shift range corresponding to an odd type check matrix according to an exemplary embodiment of the disclosure.

FIG. 16A is a schematic diagram illustrating a conventional permutation network shift range corresponding to a normal type check matrix of a prior art. FIG. 16B is a schematic diagram illustrating a provided permutation network shift range corresponding to an even type check matrix according to an exemplary embodiment of the disclosure. FIG. 16C is a schematic diagram illustrating a provided permutation network shift range corresponding to an odd type check matrix according to an exemplary embodiment of the disclosure.

Referring to FIGS. 16A and 16B together, for the permutation network 5851' of the prior art, the bit inputted into the end X1 may be shifted and outputted from one of the ends Y1 to Y8, the range of Y1 to Y8 is the conventional permutation shift range, and the conventional permutation shift range is also equal to the permutation network size, such that the conventional permutation network may be referred to as full-range permutation network. Furthermore, since the shift difference of the conventional permutation network is any value of the permutation network shift range, the permutation network shift range is corresponding to a "normal" shift type check matrix.

In another aspect, regarding to a provided permutation network, if the bit inputted into the end X1 may be shifted and outputted from one of the ends Y1, Y5, Y7 and Y9 (the shift difference is set as an "even" value of the permutation network shift range), the permutation network shift range is corresponding to an "even" shift type check matrix.

In addition, referring to FIG. 16C, regarding to a provided permutation network, if the bit inputted into the end X1 may be shifted and outputted from one of the ends Y2, Y4, Y6 and Y8 (the shift difference is set as an "odd" value of the permutation network shift range), the permutation network shift range is corresponding to a "odd" shift type check matrix.

It should be noted that the shift type of the check matrix may further includes a P-multiple shift type, wherein the "P" indicates that all the shift differences of the P-multiple shift type is a multiple of P (P may be set as an positive integer), and the shift difference would be set as a multiple of P within the permutation network shift range 0 to Z−1. And, the first permutation network and the connection relationship thereof are identified according to the P-multiple shift type check matrix in the same manner described above. For example, it is assumed that Z=8, P=3, then, one bit inputted into X1 would be outputted, by the constructed second permutation network, from one of the ends Y1, Y4 and Y7 (the shift difference would be 0, 3, or 6).

The details about the LDPC algorithm used in an embodiment of the disclosure are described below with the references of FIGS. 6 to 13. It should be mentioned that the marks, e.g., "k", "n", "M", "P", "G", "H", etc. are only used in the embodiment below and the corresponding FIGS. 6 to 13 for purpose of the explanation, the invention is not limited thereto.

In the present embodiment, the error checking and correcting circuit 508 encodes and decodes according to the LDPC algorithm. In the LDPC algorithm, a valid codeword is defined by using a check matrix (which is also referred to as a parity check matrix, hereinafter). Hereinafter, a parity check matrix is marked as a matrix H, and a codeword (i.e., the target codeword) is marked as CW. According to an equation (1) below, if a parity check matrix H multiplied by a codeword CW is a zero vector, it represents that the codeword CW is a valid codeword. Therein, an operator ⊗ represents a modulo-2 matrix multiplication. In other words, a null space of the matrix H includes all the valid codewords. However, the disclosure is not intent to limit the content of the codeword CW. For example, the codeword CW may also include the ECC or the EDC generated by using any algorithms.

$$H \otimes CW^T = 0 \qquad (1)$$

Therein, a dimension of the matrix H is k-by-n, and a dimension of the codeword CW is 1-by-n. Therein, k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n−k), and a dimension of the vector P is 1-by-k. Hereinafter, the message bits and the parity bits are collectively referred to as data bits. In other words, the codeword CW includes n data bits, in which a length of the message bits is (n−k) bits, and a length of the parity bits is k bits. Namely, a code rate of the codeword CW is (n−k)/n.

Generally, a generation matrix (marked as G hereinafter) is used during decoding, so that an equation (2) below may be satisfied by an arbitrary value of the vector M. Therein, a dimension of the generation matrix G is (n−k)-by-n.

$$M \otimes G = [M \ P] = CW \qquad (2)$$

Therein, the codeword CW generated by the equation (2) is the valid codeword. Therefore, the equation (2) is substituted into the equation (1), and an equation (3) below may be obtained accordingly.

$$H \otimes G^T \otimes M^T = 0 \qquad (3)$$

Since the vector M may be an arbitrary vector, an equation (4) below may definitely be satisfied. In other words, after the parity check matrix H is determined, the corresponding generation matrix G may also be determined.

$$H \otimes G^T = 0 \qquad (4)$$

When decoding for the codeword CW, a parity check procedure is first performed on the data bits in the codeword. For instance, the parity check matrix H may be multiplied by the codeword CW to generate a vector (hereinafter, marked as S, as shown in an equation (5) below). If the vector S is the zero vector, the codeword CW may be directly output. If the vector S is not the zero vector, it indicates that at least one error exists in the codeword CW, and the codeword CW is not the valid codeword.

$$H \otimes CW^T = S \qquad (5)$$

A dimension of the vector S is k-by-1, in which each element is also referred to as a syndrome. If the codeword CW is not the valid codeword, the error checking and correcting circuit 508 performs a decoding procedure attempting to correct an error bit in the codeword CW.

Figure 6:
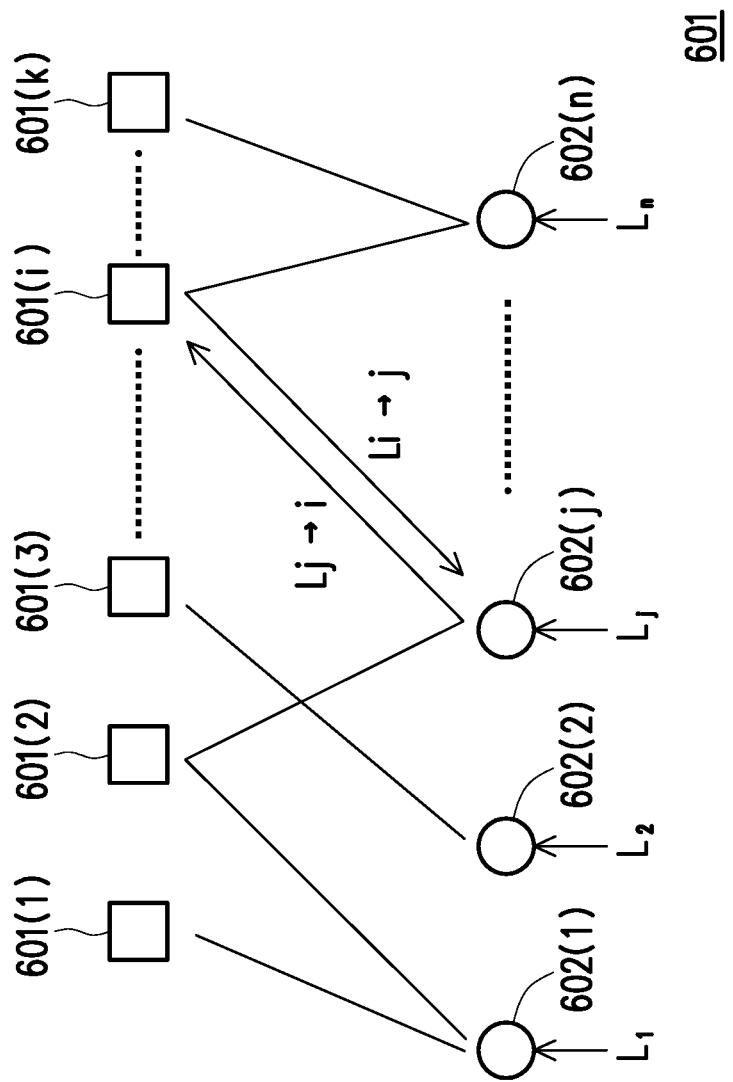
FIG. 6 is a schematic diagram illustrating belief propagation of a low density parity code (LDPC) algorithm according to an exemplary embodiment of the disclosure.

FIG. 6 is a schematic diagram illustrating belief propagation of a low density parity code (LDPC) algorithm according to an exemplary embodiment of the disclosure.

Referring to FIG. 6, the parity check matrix H may be represented as a belief propagation graph 610, including parity nodes 601(1) to 601(k) and message nodes 602(1) to 602(n). Each of the parity nodes 601(1) to 601(k) is corresponding to a syndrome, and each of the message nodes 602(1) to 602(n) is corresponding to a data bit. A corresponding relationship between the data bits and the syndromes (i.e., a connection relationship between the message nodes 602(1) to 602(n) and the parity nodes 601(1) to 601(k)) is generated according to the parity check matrix H. Particularly, if an element of an ith row and a jth column in the parity check matrix H is 1, the ith parity node 601(i) is connected to jth message node 602(j), in which i and j are positive integers.

When the memory management circuit 502 reads n data bits (which forms a codeword) from the rewritable non-volatile memory module 106, the memory management circuit 502 (or the error checking and correcting circuit 508, or the decoder 5081) also obtains reliability information (also referred to as channel reliability information) of each data bit. The reliability information is configured to represent a probability (or referred to as a reliance level) of one specific data bit to be decoded as "1" or "0". For example, in graph 610, the message nodes 602(1) to 602(n) receive corresponding reliability information $L_1$ to $L_n$. Therein, the message nodes 602(1) receives the reliability information $L_1$ of a $1^{st}$ data bit, and the message nodes $602(j)$ receives the reliability information $L_j$ of the jth data bit.

The error checking and correcting circuit 508 performs a decoding procedure according to the structure of the graph 610 and the channel reliability information $L_1$ to $L_n$. In the present embodiment, the decoding procedure performed by the error checking and correcting circuit 508 is an iterative decoding process. In the iterative decoding process, each of the message nodes $602(1)$ to $602(n)$ calculates the reliability information to each of the parity nodes $601(1)$ to $601(k)$, and each of the parity nodes $601(1)$ to $601(k)$ calculates the reliability information to each of the message nodes $602(1)$ to $602(n)$. The calculated reliability information is delivered along edges in the graph 610. For example, the reliability information transmitted by the parity node $601(i)$ to the message node $602(j)$ is reliability information $L_{i \to j}$, and reliability information transmitted by the message node $602(j)$ to the parity node $601(i)$ is reliability information $L_{j \to i}$. The reliability information is configured to represent a probability of one specific data bit to be decoded into "1" or "0". For example, the reliability information $L_{j \to i}$ represents a reliance level (which may be positive or negative) of the jth data bit to be decoded into "1" or "0" calculated by the message node $602(j)$, and the reliability information $L_{i \to j}$ represents a reliance level of the jth data bit to be decoded into "1" or "0" calculated by the parity node $601(i)$. The message nodes $602(1)$ to $602(n)$ and the parity nodes $601(1)$ to $601(k)$ calculate reliability information to be output according to the input reliability information, which is approximate to a conditional probability of a data bit to be decoded into "1" or "0". Thus, the process of delivering the reliability information is also referred to belief propagation.

As different algorithms are employed, the message nodes $602(1)$ to $602(n)$ and/or parity nodes $601(1)$ to $601(k)$ calculate different reliability information. For example, the error checking and correcting circuit 508 may employ a sum-product Algorithm, a min-sum algorithm, or a bit-flipping algorithm, and the disclosure is not intent to limit which algorithm is employed.

In the present embodiment, the iteration is continuously and repeatedly executed in the iterative decoding process to update the reliability information of at least a part of the data bits, until the valid codeword is successfully obtained, or times of executing the iteration reaches a default threshold value. For example, in each iteration of the iterative decoding process, the message nodes $602(1)$ to $602(n)$ transmit the reliability information to the parity nodes $601(1)$ to $601(k)$, and the parity nodes $601(1)$ to $601(k)$ transmit the reliability information to the message nodes $602(1)$ to $602(n)$.

Each time after the iteration is executed, the error checking and correcting circuit 508 calculates whether each data bit is to be decoded into a bit of "1" or "0" according to the current reliability information and verify each of the calculated data bits. For example, the error checking and correcting circuit 508 performs the parity check procedure to verify the calculated data bits. In the parity check procedure, the error checking and correcting circuit 508 multiplies the codeword generated by the data bits with its corresponding parity check matrix and thereby, determines whether the codeword is the valid codeword. If the generated codeword is the valid codeword, it represents a decoding success, and the iterative decoding process ends. If the generated codeword is not the valid codeword, the next iteration is executed. Additionally, if the times of the iteration of the iterative decoding process is over a default value, the iteration decoding operation also ends, which represents a decoding failure.

FIG. 7 is a schematic diagram illustrating a parity check matrix according to an exemplary embodiment of the disclosure.

Referring to FIG. 7, a dimension of parity check matrix 700 is 6-by-9, but the disclosure does not limit specific values that the positive integers k and n should be. Each row of the parity check matrix 700 represents a constraint. Taking the first row of the parity check matrix 700 as an example, if a specific codeword is a valid codeword, a bit of "0" is obtained after a modulo-2 addition is performed on the $2^{nd}$, $6^{th}$ and $7^{th}$ bits in the codeword. It should be understood for a person of ordinary skill in the art how to encode by using the parity check matrix 700 and this, will not be repeatedly described. Additionally, the parity check matrix 700 is merely an exemplary matrix and construes no limitations to the disclosure.

When the memory management circuit 502 intends to write a plurality of bits into the rewritable non-volatile memory module 406, the error checking and correcting circuit 508 generates k bits (i.e., parity bits) corresponding to each (n–k) bits (i.e., message bits) to be written. The memory management circuit 502 writes the n bits (i.e., data bits) serving as a codeword into the rewritable non-volatile memory module 406.

The memory management circuit 502 receives a read command from the host system 11. The memory management circuit 502 transmits a read command sequence to the rewritable non-volatile memory module 406 according to the read command. The read command sequence instructs the rewritable non-volatile memory module 406 to read at least one physical unit. The rewritable non-volatile memory module 406 performs a corresponding reading operation (e.g., applies a read voltage to a specific physical unit to read data stored in at least one memory cell) according to the read command sequence and returns response data to the memory management circuit 502. The memory management circuit 502 receives the response data from the rewritable non-volatile memory module 406, and the error checking and correcting circuit 508 performs an iterative decoding process on the response data.

In the present embodiment, the decoder 5081 (or decoding controller 581) identifies an offset threshold value (e.g., the permutation network shift range) according to the permutation circuit 585. The decoder 5081 (or decoding controller 581) identifies a check matrix (e.g., the parity check matrix 700 illustrated in FIG. 7) corresponding to the permutation circuit 585. The error checking and correcting circuit 508 performs the aforementioned encoding and decoding procedure according to the check matrix. The description related to the encoding and decoding procedure is set forth in detail above and will not be repeated.

In the present embodiment, the determined check matrix includes a plurality of sub-matrices. The sub-matrices are grouped into at least one sub-matrix group. Each sub-matrix has a default dimension (default dimension value). Specifically, the determined offset threshold value is less than a default dimension value corresponding to the default dimension. For example, if the default dimension of each sub-matrix is 3-by-3, the default dimension value corresponding to the default dimension is "3".

In the iterative decoding process, the error checking and correcting circuit 508 generates a data set (e.g., a set of all initial variable groups) corresponding to the received response data (e.g., target codeword). The data set includes a plurality of (initial variable) groups. The decoder 5081 (or decoding controller 581) shifts the groups in the data set according to the determined offset threshold value and different sub-matrix groups of the determined check matrix to obtain a plurality of shift groups, such that an offset of each group of the data set with respect to each shifting (also referred to group shifting) is not over the determined offset threshold value. It should be noted that, the group shifting referred herein refers to that the bits of each group are shifted with each group as a unit. For example, if it is assumed that a certain group (variable groups) include elements (e.g., variables) of "$A_1$", "$A_2$" and "$A_3$" which are sequentially permuted, after a group shifting operation with an offset of "1" (i.e., the offset=1) is performed on the certain group, the permutation sequence of the elements in the certain group is changed as the elements "$A_3$", "$A_1$" and "$A_2$", and the sequentially permuted elements "$A_3$", "$A_1$" and "$A_2$" may be considered as a shift group with respect to the sequentially permuted elements "$A_1$", "$A_2$" and "$A_3$", and an offset of each of the sequentially permuted elements "$A_3$", "$A_1$" and "$A_2$" with respect to each of the sequentially permuted elements "$A_1$", "$A_2$" and "$A_3$" is "1". Then, the error checking and correcting circuit 508 generates decoding reference data according to the shift groups. The decoding reference data is used in the iterative decoding process.

In an embodiment, the generated decoding reference data is a syndrome set (also referred to as a syndrome vector) corresponding to a parity check procedure and configured to verify whether a specific codeword is a valid codeword (or, whether the decoding successes). In an embodiment, the generated decoding reference data is a syndrome weight set (also referred to as a syndrome weight vector) corresponding to a bit-flipping algorithm and configured to determine which data bit is to be flipped. In an embodiment, the generated decoding reference data is a minimum value set (also referred to as a minimum vector) corresponding to a min-sum algorithm and configured to determine the reliability information of at least part of the data bits. Several exemplary embodiments will be provided to describe how to perform a group shift on a data sets in the iterative decoding process and generate corresponding decoding reference data.

FIG. 8 is a schematic diagram illustrating a parity check procedure according to an exemplary embodiment of the disclosure. In the present embodiment, the data set and the decoding reference data are used in a parity check procedure of the LDPC algorithm. For example, the data set refers to the codeword to be verified in the parity check procedure, and the decoding reference data is a syndrome set generated in the parity check procedure.

Referring to FIG. 8, the decoder 5081 (or decoding controller 581) identifies an offset threshold value. In the present embodiment, the determined offset threshold value is "2". The memory management circuit 502 identifies a parity check matrix 800 corresponding to the determined offset threshold value. The parity check matrix 800 is used for encoding while a data storage operation is performed and for decoding while a data reading operation is performed.

In the present embodiment, the parity check matrix 800 includes sub-matrix groups 830 and 840. The sub-matrix groups 830 and 840 include sub-matrices 831 to 833 and sub-matrices 841 to 843 permuted in a row direction, respectively. Each of the sub-matrices 831 to 833 and 841 to 843 is a square matrix and has a default dimension. For example, the default dimension of each of the sub-matrices 831 to 833 and 841 to 843 is 3-by-3, and a default dimension value corresponding to the default dimension is "3".

In the present embodiment, after the memory management circuit 502 transmits the read command sequence and receives the response data corresponding to the read command sequence, the error checking and correcting circuit 508 performs an iterative decoding process on the response data. In a specific iteration of the iterative decoding process, a codeword 810 is determined and is verified whether to be a valid codeword in a corresponding parity check procedure.

To be specific, in the parity check procedure corresponding to the codeword 810, the error checking and correcting circuit 508 obtains a result of matrix multiplication of the parity check matrix 800 and the codeword 810 and serves the result as a syndrome set 820 (also referred to as final syndrome). For example, a syndrome $S_1$ in the syndrome set 820 is obtained by performing a modulo-2 addition on bits $A_2$, $B_3$ and $C_1$ in the codeword 810 corresponding to positions having elements of 1 in the first row of the parity check matrix 800, a syndrome $S_2$ in the syndrome set 820 is obtained by performing a modulo-2 addition on bits $A_3$, $B_1$ and $C_2$ in the codeword 810 corresponding to positions having elements of 1 in the second row of the parity check matrix 800, a syndrome $S_4$ in the syndrome set 820 is obtained by performing a modulo-2 addition on bits $A_3$, $B_1$ and $C_2$ in the codeword 810 corresponding to positions having elements of 1 in the fourth row of the parity check matrix 800. In the same way, syndromes $S_1$ to $S_6$ in the syndrome set 820 are obtained. Thereafter, the error checking and correcting circuit 508 determines whether errors exist in the codeword 810 according to whether the syndrome set 820 is the zero vector (i.e., whether all of the syndrome $S_1$ to $S_6$ are "0"). For example, if all of the syndromes $S_1$ to $S_6$ are "0", the error checking and correcting circuit 508 determines that no errors exit in the codeword 810 (i.e., the codeword 810 is the valid codeword) and outputs decoded data according to the codeword 810. However, if at least one of the syndromes $S_1$ to $S_6$ is "1", the error checking and correcting circuit 508 determines that at least one error exists in the codeword 810. If the error checking and correcting circuit 508 determines that the codeword 810 has error and the times of the executed iteration does not yet reach the default threshold value, the error checking and correcting circuit 508 performs the next iteration on the codeword 810 and perform the parity check procedure again to verify the generated codeword. Additionally, in an embodiment, the decoding efficiency may be reinforced by mechanisms, such as reading the same physical unit again using a changed read voltage level or changing the decoding manner, which will be no longer described hereinafter.

In the present embodiment, the error checking and correcting circuit 508 does not actually perform the matrix multiplication as illustrated in FIG. 8. Instead, the error checking and correcting circuit 508 performs group shifting and the matrix addition on the codeword 810 corresponding to the sub-matrix groups 830 and 840 in the parity check matrix 800 to obtain the syndrome set 820. This is because in several cases, performing the matrix addition with respect to performing the matrix multiplication has a lower complexity and/or a higher computing speed. In other words, the error checking and correcting circuit 508 gradually generates the syndrome set 820 layer by layer. For example, the sub-matrix group 830 is the first layer and used to calculate the syndromes $S_1$ to $S_3$ in the syndrome set 820, and the sub-matrix group 840 is the second layer and used to calculate the syndromes syndrome $S_4$ to $S_6$ in the syndrome set 820.

In the present embodiment, the error checking and correcting circuit 508 groups a plurality of groups (also referred to as default groups) in the codeword 810 corresponding to the default dimension of each sub-matrix in the parity check matrix 800. For example, corresponding to the sub-matrix having the default dimension of 3-by-3, the bits $A_1$, $A_2$ and $A_3$ in the codeword 810 are grouped to the same default group (referred to as a first default group hereinafter), the bits $B_1$, $B_2$ and $B_3$ in the codeword 810 are grouped to the same default groups (referred to as a second default groups hereinafter), the bits $C_1$, $C_2$, $C_3$ in the codeword 810 are grouped to the same default group (referred to as a third default group). In a corresponding group shifting operation, each bit in the codeword 810 is shifted depending on which group the bit belong to. In other words, offsets of a plurality of bits belonging to the same group in one group shifting operation are the same, while offsets of a plurality of bits belonging to different groups in one group shifting operation may be the same or different. For example, in a group shifting operation corresponding to a specific layer, offsets of the bits $A_1$, $A_2$ and $A_3$ belonging to the first default group are the same; however, offsets of the bits $A_1$ and $B_1$ respectively belonging to the first default group and the second default groups may be the same or different.

FIG. 9 is a schematic diagram of obtaining a syndrome set corresponding to the parity check procedure according to an exemplary embodiment of the disclosure.

Referring to FIG. 8 and FIG. 9, a group shifting operation corresponding to the sub-matrix group 830 (i.e., the first layer, or the first group layer) is first performed. For example, corresponding to each position in the sub-matrix group 830 having the element of 1, the bits $A_1$, $A_2$ and $A_3$ in the codeword 810 are shifted, by the permutation circuit, as in the permutation of the bits $A_2$, $A_3$ and $A_1$, the bits $B_1$, $B_2$ and $B_3$ in the codeword 810 are shifted as in the permutation of the bits $B_3$, $B_1$ and $B_2$, and the bits $C_1$, $C_2$ and $C_3$ in the codeword 810 are not shifted. Therefore, a codeword 910 including the sequentially permuted bits $A_2$, $A_3$, $A_1$, $B_3$, $B_1$, $B_2$, $C_1$, $C_2$ and $C_3$ as illustrated in FIG. 9 is obtained.

In the present embodiment, the bits $A_2$, $A_3$ and $A_1$ in the codeword 910 are considered as belonging to a shift group 911 corresponding to the first default group, the bits $B_3$, $B_1$ and $B_2$ in the codeword 910 are considered as belonging to a shift group 912 corresponding to the second default group, the bits $C_1$, $C_2$ and $C_3$ in the codeword 910 are considered as belonging to a shift group 913 corresponding to the third default group. Therein, an offset of the shift group 911 with respect to the first default group is "1" (i.e., the offset(or shift difference)=1), an offset of the shift group 912 with respect to the second default group is "2" (i.e., the offset=2), and an offset of the shift group 913 with respect to the third default group is "0" (i.e., the offset=0). Then, the error checking and correcting circuit 508 generates part of the syndromes in the syndrome set 820 according to the shift groups 911 to 913. For example, the error checking and correcting circuit 508 performs the matrix addition on the shift groups 911 to 913 to obtain the syndromes $S_1$ to $S_3$ in the syndrome set 820.

After the shift groups 911 to 913 are obtained, a group shifting operation corresponding to the sub-matrix group 840 (i.e., the second layer, or the second group layer) is performed. For example, corresponding to each position in the sub-matrix group 840 having the element of 1, the bits $A_2$, $A_3$ and $A_1$ in the shift group 911 are shifted as in the permutation of the bits $A_3$, $A_1$ and $A_2$, the permutation of the bits $B_3$, $B_1$ and $B_2$ in the shift group 912 are shifted as in the permutation of the bits $B_1$, $B_2$ and $B_3$, and the bits $C_1$, $C_2$ and $C_3$ in the shift groups 913 are shifted as in the permutation of the bits $C_2$, $C_3$ and $C_1$. Therefore, a codeword 920 including the sequentially permuted bits $A_3$, $A_1$, $A_2$, $B_1$, $B_2$, $B_3$, $C_2$, $C_3$ and $C_1$ as illustrated in FIG. 9 is obtained.

In the present embodiment, the bits $A_3$, $A_1$ and $A_2$ in the codeword 920 are considered as belonging to a shift group 921 corresponding to the shift group 911, the bits $B_1$, $B_2$ and $B_3$ in the codeword 920 are considered as belonging to a shift group 922 corresponding to the shift group 912, and the bits $C_2$, $C_3$ and $C_1$ in the codeword 920 are considered as belonging to a shift group 923 corresponding to the shift groups 913. Therein, an offset of the shift group 921 with respect to the shift group 911 is "1" (i.e., the offset=1), an offset of the shift group 922 with respect to the shift group 912 is "1" (i.e., the offset=1), and an offset of the shift group 923 with respect to the shift group 913 is "1" (i.e., the offset=1). Then, the error checking and correcting circuit 508 generates another part of the syndromes in the syndrome set 820 according to the shift groups 921 to 923. For example, the error checking and correcting circuit 508 performs the matrix addition on the shift groups 921 to 923 to obtain the syndromes $S_4$ to $S_6$ in the syndrome set 820.

The error checking and correcting circuit 508 (or the decoder 5081) constrains that the offset of the group shifting performed corresponding to each sub-matrix group (i.e., each layer) is not over the determined offset threshold value (e.g., within the permutation network shift range). For example, in the exemplary embodiments illustrated in FIG. 8 and FIG. 9, the offset threshold value is set to "2", and thus, the offset of each shift groups 911 to 913 with respect to an corresponding group in the codeword 810 is not over "2", and the offset of each of the shift groups 921 to 923 with respect to the shift groups 911 to 913, respectively, is also not over "2". For example, during the operation of performing the group shifting corresponding to the sub-matrix group 830 (i.e., the first layer) to generate the shift groups 911 to 913, the offset of each bit in the codeword 810 may be "0", "1" or "2", which depends on the group to which the bit belongs, and during the operation of performing the group shifting corresponding to the sub-matrix group 840 (i.e., the second layer) to generate the shift groups 921 to 923, the offset of each bit in the codeword 920 may be "0", "1" or "2", which depends on the group to which the bit belongs. Additionally, in another exemplary embodiment of FIG. 8 and FIG. 9, if the offset threshold value is set to "1", the offset with respect to the bits in each shift group is not over "1" in each group shifting operation.

In an embodiment, if the syndrome set generated in the parity check procedure is not the zero vector (e.g., at least one of the syndromes $S_1$ to $S_6$ in FIG. 8 is "1"), it represents that at least one error exists in the currently verified codeword. Thus, a bit-flipping algorithm may be used to quickly determine which bit in the codeword is to be flipped, for example, a value of a certain bit is changed from "0" to "1", or from "1" to "0", to attempt to correct the error in the codeword. In the bit-flipping algorithm, a syndrome weight set corresponding to the syndrome set is calculated, and at least one bit in the codeword is flipped according to the syndrome weight set. In an embodiment, the group shifting is performed on a plurality of groups in the data set to obtain the corresponding decoding reference data, such that the complexity of calculating the syndrome weight set may be reduced, and/or the computing speed may be increased. However, in another exemplary embodiment, if it is determined that the currently verified codeword has an error, other decoding algorithms may also be used to correct the error in the codeword.

FIG. 10 and FIG. 11 are schematic diagrams of obtaining a syndrome set corresponding to the bit-flipping algorithm according to another exemplary embodiment of the disclosure. In the present embodiment, both the data set and the decoding reference data are used in the bit-flipping algorithm. For example, the data set refers to the syndrome weight set to be updated in the bit-flipping algorithm, and the decoding reference data refers to the updated syndrome weight set in the bit-flipping algorithm.

Referring to FIG. 10, after the syndrome set 820 is obtained, a syndrome weight set 1001 is determined in the bit-flipping algorithm. For example, the syndrome weight set 1001 includes syndrome weights $EA_1$, $EA_2$, $EA_3$, $EB_1$, $EB_2$, $EB_3$, $EC_1$, $EC_2$ and $EC_3$ permuted in an order. Therein, the syndrome weights $EA_1$, $EA_2$, $EA_3$, $EB_1$, $EB_2$, $EB_3$, $EC_1$, $EC_2$ and $EC_3$ are corresponding to the bits $A_1$, $A_2$, $A_3$, $B_1$, $B_2$, $B_3$, $C_1$, $C_2$ and $C_3$ in the codeword 810, respectively. The syndrome weight set 1001 may be used to represent a degree of each bit of the codeword 810 participating in the error existing in the codeword 810. For example, according to the parity check matrix 800, the bit $A_1$ participates in the calculation of the syndromes $S_3$ and $S_5$, and thus, the syndrome weight $EA_1$ corresponding to the bit $A_1$ may be calculated according to the syndromes $S_3$ and $S_5$. For example, the syndromes $S_3$ and $S_5$ may be added with each other to obtain the syndrome weight $EA_1$. Moreover, according to the parity check matrix 800, the bit $A_2$ participates in the calculation of the syndromes $S_1$ and $S_6$, and thus, the syndrome weight $EA_2$ corresponding to the bit $A_2$ may be calculated according to the syndromes $S_1$ and $S_6$. For example, the syndrome $S_1$ and $S_6$ may be added with each other to obtain the syndrome weight $EA_2$. Specifically, the addition used to calculate the syndrome weights in this case refers to an ordinary addition, instead of the modulo-2 addition. For example, if both the syndromes $S_3$ and $S_5$ are "1", the syndrome weight $EA_1$, which is "2", is obtained by adding the syndrome $S_3$ with syndrome $S_5$. In the same way, the syndrome weight set 1001 is obtained according to the parity check matrix 800 and the syndrome set 820.

In the bit-flipping algorithm, if a syndrome weight corresponding to a certain bit in the codeword has a large value, it represents that the bit is highly probable to be an error bit, and thus, it is highly probable that the error may be corrected by flipping the bit. In contrast, if a syndrome weight corresponding to a certain bit in the codeword is small, it represents that the bit is less probable to be an error bit, and thus, it is less probable that the error may be corrected by flipping the bit. Generally, the operation of obtaining the syndrome weight set 1001 according to the parity check matrix 800 and the syndrome set 820 may be equivalent to the operation of obtaining the syndrome weight set 1001 by adding a vector 1002 with a vector 1003. Therein, elements in the vector 1002 include the syndromes $S_1$ to $S_3$, and elements in the vector 1003 include the syndromes $S_4$ to $S_6$. Positions of the syndromes $S_1$ to $S_3$ in the vector 1002 are determined according to the parity check matrix 800, and positions of the syndromes $S_4$ to $S_6$ in the vector 1003 are also determined according to the parity check matrix 800.

In the present embodiment, the error checking and correcting circuit 508 (or the decoder 5081) also generates the syndrome weight set 1001 gradually with each layer as the unit. For example, the sub-matrix group 830 is the first layer and configured to perform a first update operation for the syndrome weight set, and the sub-matrix group 840 is the second layer and configured to perform a second update operation for the syndrome weight set. In the present embodiment, the error checking and correcting circuit 508 groups a plurality of syndrome weights in the vector 1001 into a plurality of default groups. For example, the syndrome weights $EA_1$, $EA_2$ and $EA_3$ belong to the first default group, the syndrome weights $EB_1$, $EB_2$ and $EB_3$ belong to the second default groups, and the syndrome weights $EC_1$, $EC_2$ and $EC_3$ belong to the third default group.

Referring to FIG. 11, the group shifting operation corresponding to the sub-matrix group 830 (i.e., the first layer, or the first group layer) is first performed. For example, corresponding to the positions having the element of 1 in the sub-matrix group 830, the syndrome weights $EA_1$, $EA_2$ and $EA_3$ belonging to the first default group are shifted as in the permutation of the syndrome weights $EA_2$, $EA_3$ and $EA_1$, the syndrome weights $EB_1$, $EB_2$ and $EB_3$ belonging to the second default groups are shifted as in the permutation of the bits $EB_3$, $EB_1$, $EB_2$, and the syndrome weights $EC_1$, $EC_2$ and $EC_3$ belonging to the third default group are not shifted. Therefore, a vector 1101 including the sequentially permuted syndrome weights $EA_2$, $EA_3$, $EA_1$, $EB_3$, $EB_1$, $EB_2$, $EC_1$, $EC_2$ and $EC_3$ illustrated in FIG. 11 is obtained. For example, the syndrome weights $EA_2$, $EA_3$ and $EA_1$ in the vector 1101 belong to a shift group with respect to the first default group; the syndrome weights $EB_3$, $EB_1$ and $EB_2$ in the vector 1101 belong to a shift group with respect to the second default group, and the syndrome weights $EC_1$, $EC_2$ and $EC_3$ in the vector 1101 belong to a shift group with respect to the third default group.

Afterwards, the error checking and correcting circuit 508 (or the decoder 5081) generates a vector 1102 by using vectors 1103 and 1104. Therein, all elements are permuted in the same way in the vectors 1101 to 1103, as illustrated in FIG. 11. Additionally, initial values of all the elements in the vector 1103 are set to "0". In the present embodiment, the operation of generating the vector 1102 may also be considered as an operation of updating the vector 1103 as the vector 1102. For example, in the operation of updating the vector 1103 as the vector 1102, the syndrome weights $EA_2$, $EA_3$ and $EA_1$ in the vector 1103 are respectively added with the syndromes $S_1$, $S_2$ and $S_3$ in the vector 1104 to obtain the updated syndrome weights $EA_2$, $EA_3$ and $EA_1$ in the vector 1102, the syndrome weights $EB_3$, $EB_1$ and $EB_2$ in the vector 1103 are respectively added with the syndromes $S_1$, $S_2$ and $S_3$ in the vector 1104 to obtain the updated syndrome weights $EB_3$, $EB_1$ and $EB_2$ in the vector 1102, and the syndrome weights $EC_1$, $EC_2$ and $EC_3$ in the vector 1103 are respectively added with the syndrome weights $S_1$, $S_2$ and $S_3$ in the vector 1104 to obtain the updated syndrome weights $EC_1$, $EC_2$ and $EC_3$ in the vector 1102.

After the vector 1102 is obtained, the group shifting operation corresponding to the sub-matrix group 840 (i.e., the second group layer) is performed. For example, corresponding to the positions having the element of 1 in the sub-matrix group 840, the syndrome weights $EA_2$, $EA_3$ and $EA_1$ in the vector 1102 are shifted as in the permutation of the syndrome weights $EA_3$, $EA_1$ and $EA_2$, the syndrome weights $EB_3$, $EB_1$ and $EB_2$ in the vector 1102 are shifted as in the permutation of the syndrome weights $EB_1$, $EB_2$ and $EB_3$, and the syndrome weights $EC_1$, $EC_2$ and $EC_3$ in the vector 1102 are shifted as in the permutation of the syndrome weights $EC_2$, $EC_3$ and $EC_1$. Therefore, a vector 1105 including the sequentially permuted syndrome weights $EA_3$, $EA_1$, $EA_2$, $EB_1$, $EB_2$, $EB_3$, $EC_2$, $EC_3$ and $EC_1$ as illustrated in FIG. 11 is obtained.

Afterwards, the error checking and correcting circuit 508 (or the decoder 5081) generates a vector 1106 by using vectors 1107 and 1108. Therein, all elements are permuted in the same way in the vectors 1105 to 1107, as illustrated in FIG. 11. Additionally, the operation of generating the vector 1106 may also be considered as an operation of updating the vector 1107 as the vector 1106. For example, in the operation of updating the vector 1107 as the vector 1106, the syndrome weights $EA_3$, $EA_1$ and $EA_2$ in the vector 1107 are respectively added with the syndromes $S_4$, $S_5$ and $S_6$ in the vector 1108 to obtain the updated syndrome weights $EA_3$, $EA_1$ and $EA_2$ in the vector 1106, the syndrome weights $EB_1$, $EB_2$ and $EB_3$ in the vector 1107 are respectively added with the syndromes $S_4$, $S_5$ and $S_6$ in the vector 1108 to obtain the updated syndrome weights $EB_1$, $EB_2$ and $EB_3$ in the vector 1106, and the syndrome weights $EC_2$, $EC_3$ and $EC_1$ in the vector 1107 are respectively added with the syndromes $S_4$, $S_5$ and $S_6$ in the vector 1108 to obtain the updated syndrome weights $EC_2$, $EC_3$ and $EC_1$ in the vector 1106. The generated vector 1106 includes the syndrome weights corresponding to all bits in the codeword 810 illustrated in FIG. 10. In other words, the operation of sequentially updating the vectors 1102 and 1106 in the exemplary of FIG. 11 in replacement with the operation of adding the vectors 1102 with the vector 1003 illustrated in FIG. 10 may contribute to increasing the efficiency of calculating the syndrome weight set in the bit-flipping algorithm.

In an embodiment, if the error checking and correcting circuit 508 updates the reliability info nation in the iterative decoding process by using a sum-product algorithm, the operation of performing the group shifting on a plurality of groups in the data set to obtain the corresponding decoding reference data may also be applied to reduce the computation complexity of performing the min-sum algorithm and/or increasing the computing speed.

FIG. 12 and FIG. 13 are schematic diagrams of obtaining a minimum value set corresponding to a min-sum algorithm according to another exemplary embodiment of the disclosure. In the present embodiment, both the data set and the decoding reference data are used in the min-sum algorithm. For example, the data set refers to the codeword to be decoded, and decoding reference data is a minimum value set generated in the min-sum algorithm.

Referring to FIG. 12, in an iterative decoding process using the min-sum algorithm, the error checking and correcting circuit 508 (or the decoder 5081) performs multiple comparisons on different bits in the codeword (e.g., target codeword) 810 according to the parity check matrix 800 to generate a minimum value set 1201. For example, the minimum value set 1201 include minimum values $m_1$ to $m_6$. Therein, the minimum value $m_1$ is the minimum value selected from the bits $A_2$, $B_3$ and $C_1$ in the codeword 810, the minimum value $m_2$ is the minimum value selected from the bits $A_3$, $B_1$ and $C_2$ in the codeword 810, the minimum value $m_3$ is the minimum value selected from the bits $A_1$, $B_2$ and $C_3$ in the codeword 810, the minimum value $m_4$ is the minimum value selected from the bits $A_3$, $B_1$ and $C_2$ in the codeword 810, the minimum value $m_5$ is the minimum value selected from the bits $A_1$, $B_2$ and $C_3$ in the codeword 810, and the minimum value $m_6$ is the minimum value selected from the bits $A_2$, $B_3$ and $C_1$ in the codeword 810.

In the present embodiment, the error checking and correcting circuit 508, likewise, generates the minimum value set 1201 gradually with each layer as the unit. For example, the sub-matrix group 830 is the first layer and configured to calculate the syndromes $m_1$ to $m_3$ in the minimum value set 1201, and the sub-matrix group 840 is the second layer and configured to calculate the syndromes $m_4$ to $m_6$ in the minimum value set 1201. In the present embodiment, the error checking and correcting circuit 508 groups the bits in the codeword 810 into a plurality of default groups. For example, the bits $A_1$, $A_2$ and $A_3$ in the codeword 810 belong to the first default group, the bits $B_1$, $B_2$ and $B_3$ in the codeword 810 belong to the second default group, and the bits $C_1$, $C_2$ and $C_3$ in the codeword 810 belong to the third default group.

Referring to FIG. 13, the group shifting operation corresponding to the sub-matrix group 830 (i.e., the first group layer) is first performed. For example, corresponding to the positions having the element of 1 in the sub-matrix group 830, the bits $A_1$, $A_2$ and $A_3$ in the codeword 810 are shifted as in the permutation of the bits $A_2$, $A_3$, $A_1$, the bits $B_1$, $B_2$ and $B_3$ in the codeword 810 are shifted as in the permutation of the bits $B_3$, $B_1$ and $B_2$, and the bits $C_1$, $C_2$ and $C_3$ in the codeword 810 are not shifted. Therefore, a codeword 910 including the sequentially permuted bits $A_2$, $A_3$, $A_1$, $B_3$, $B_1$, $B_2$, $C_1$, $C_2$ and $C_3$ as illustrated in the FIG. 13 is obtained. For example, the bits $A_2$, $A_3$ and $A_1$ in the codeword 910 belong to a shift group 911 with respect to the first default group, the bits $B_3$, $B_1$ and $B_2$ in the codeword 910 belong to a shift group 912 with respect to the second default group, and the bits $C_1$, $C_2$, $C_3$ in the codeword 910 belong to a shift group 913 with respect to the third default group.

Afterwards, the error checking and correcting circuit 508 (or the decoder 5081) selects minimum values from the bits located at specific positions in the shift groups 911 to 913 to generate the syndromes $m_1$ to $m_3$ in the minimum value set 1201. For example, the error checking and correcting circuit 508 selects the minimum value from the bits $A_2$, $B_3$ and $C_1$ located at the first position of each group in the shift groups 911 to 913 and serves it as $m_1$, selects the minimum value from the bits $A_3$, $B_1$ and $C_2$ located at the second position of each group in the shift groups 911 to 913 and serves it as $m_2$, and selects the minimum value from the bits $A_1$, $B_2$ and $C_3$ located at the third position of each group in the shift groups 911 to 913 and serves it as $m_3$.

After the shift groups 911 to 913 are obtained, the group shifting operation corresponding to the sub-matrix group 840 (i.e., the second group layer) is performed. For example, corresponding to the positions having the element of 1 in the sub-matrix group 840, the bits $A_2$, $A_3$ and $A_1$ in the shift group 911 are shifted as in the permutation of the bits $A_3$, $A_1$ and $A_2$, the bits $B_3$ and $B_1$, $B_2$ in the shift groups 912 are shifted as in the permutation of the bits $B_1$, $B_2$ and $B_3$, and the bits $C_1$, $C_2$ and $C_3$ in the shift groups 913 are shifted in the permutation of the bits $C_2$, $C_3$, $C_1$. Therefore, a codeword 920 including the sequentially permuted bits $A_3$, $A_1$, $A_2$, $B_1$, $B_2$, $B_3$, $C_2$, $C_3$ and $C_1$ as illustrated in FIG. 13 is obtained. For example, the bits $A_3$, $A_1$ and $A_2$ in the codeword 920 are considered as belonging to the shift group 921 corresponding to the shift group 911, the bits $B_1$, $B_2$ and $B_3$ in the codeword 920 are considered as belonging to the shift group 922 corresponding to the shift group 912, and the bits $C_2$, $C_3$ and $C_1$ in the codeword 920 are considered as belonging to the shift group 923 corresponding to the shift group 913.

Afterwards, the error checking and correcting circuit 508 selects minimum values from the bits located at specific positions in the shift groups 921 to 923 to generate the syndromes $m_4$ to $m_6$ in the minimum value set 1201. For example, the error checking and correcting circuit 508 selects the minimum value from the bits $A_3$, $B_1$ and $C_2$ located at the first position of each group in the shift groups 921 to 923 and serves it as $m_4$, selects the minimum value from the bits $A_1$, $B_2$ and $C_3$ located at the second position of each group in the shift groups 921 to 923 and serves it as $m_5$, and selects the minimum value from the bits $A_2$, $B_3$ and $C_1$ located at the third position of each group in the shift groups shift groups 921 to 923 and serves it as $m_6$. Thereby, minimum value set 1201 used in the min-sum algorithm may be obtained and the computation efficiency may be increased.

Based on the above, in the exemplary embodiments, even the aforementioned operations are respectively corresponding to different stages of the iterative decoding process and/or corresponding to different decoding algorithms, the operations of setting the offset threshold value, setting the parity check matrix, setting the groups in the data set, and the operations of performing the group shifting operation corresponding to each group layer in the data set (or variable groups) are the same or similar. In other words, for different stage in the iterative decoding process and/or different decoding algorithms, different kinds of data may be served as the data set and different kinds of logical operations may be performed according to the shifted groups.

In an embodiment, the determined offset threshold value is negatively correlated to a column weight corresponding to the employed parity check matrix. Therein, the column weight of the parity check matrix is corresponding to the number of elements of 1 contained in a certain column in the parity check matrix. For example, as the offset threshold value becomes greater, the number of elements of 1 contained in a certain column of the employed parity check matrix may be smaller, while as the offset threshold value becomes smaller, the number of elements of 1 contained in a certain column of the employed parity check matrix may be more. In an embodiment, the column weight of the parity check matrix is corresponding to the number of elements of 1 contained in a column which contains the greatest number of elements of 1 in the parity check matrix. For example, in a certain parity check matrix, a certain column contains two elements of 1, and another column contains three elements of 1, and thus, the column weight of the parity check matrix may be determined as "3".

It should be mentioned that the foregoing provided permutation circuit is used in this QC-LDPC decoder applying a Min-Sum Algorithm, but the disclosure is not limited hereto. For example, another QC-LDPC decoder applying a Sum-Product Algorithm (SPA), or Bit-Flipping Algorithm, Offset Min-Sum Algorithm, etc., may use the permutation circuit provided according to the foregoing embodiment.

To summarize, in the embodiments of the disclosure, the provided permutation network designing method can construct an improved second permutation network used for disposing less selectors and routing wires in the permutation circuit of a QC-LDPC decoder by removing a target first permutation layer from a first permutation network according to the shift type of a check matrix of the QC-LDPC decoder, such that the permutation circuit's hardware cost would be reduced, and the power consumption and generated heat would be decreased accordingly. Furthermore, the decoding performance of the provided permutation circuit is not much decreased while saving some hardware elements for construct the permutation circuit.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A permutation network designing method for a permutation circuit of a quasi-cyclic low-density parity check (QC-LDPC) decoder corresponding to a rewritable non-volatile memory module, comprising:

identifying a size of a physical page of the rewritable non-volatile memory module as a page size, wherein the physical page is configured to store a plurality of codewords;

obtaining a length of each of the codewords as a codeword length according to the amount of the codewords and the page size;

identifying a predetermined check matrix of the QC-LDPC decoder, wherein the check matrix comprises M×N sub-matrices, wherein each of the sub-matrices is a Z×Z matrix, wherein Z is a default dimension value of each of the sub-matrices, and the default dimension value is a quotient obtained by dividing the codeword length with N;

calculating a first value according to the default dimension value, and identifying a first permutation network according to the first value, the default dimension value, and a shift type of the check matrix, wherein the first permutation network comprises a plurality of first permutation layers arranged sequentially, and each of the first permutation layers has the same amount of first nodes, wherein the amount of the first permutation layers is set by the first value, and the amount of the first nodes of each of the first permutation layers is set by the default dimension value, wherein every first node of one of the first permutation layers connects to a pair of first nodes of the next one first permutation layer among the first permutation layers;

identifying a target first permutation layer among the first permutation layers of the first permutation network according to the shift type of the check matrix, and constructing a second permutation network by removing the target first permutation layer from the first permutation network; and disposing a plurality of selectors on a plurality of second nodes of the second permutation network of the permutation circuit, and disposing a plurality of routing wires into the permutation circuit to connect the selectors according to the second permutation network, wherein the selectors further respectively connect to a decoding controller of the QC-LDPC decoder, wherein the decoding controller is configured to control the selectors to shift a plurality of first variable groups corresponding to a target codeword as a plurality of second variable groups, wherein the second variable groups are respectively shifted according to a plurality of target offsets corresponding to the first variable groups and the second variable groups, wherein the target offsets are identified according to the check matrix.

2. The permutation network designing method according to claim 1, wherein each of the first variable groups comprises a plurality of variables, wherein each of the variables comprises a plurality of bits representing a reliability value, wherein the total amount of the bits is set by a preset fineness value, wherein an initial first variable group among the first variable groups comprises a plurality of initial variables, and the initial variables are obtained by looking-up a decoding table according to the target codeword, or by being converted from the target codeword.

3. The permutation network designing method according to claim 2, wherein each of the second nodes of the first one of the second permutation layers connects to each of a plurality of input ends of the permutation circuit, and each of the second nodes of the last one of the second permutation layers connects to two of a plurality of output ends of the permutation circuit, wherein the step of shifting the plurality of first variable groups corresponding to the target codeword as the plurality of second variable groups comprises:
inputting, by the decoding controller, respectively all the variables in one of the first variable groups into different input ends, wherein all the inputted variables are transmitted respectively to all the nodes of the first one of the second permutation layers by all the input ends;
shifting, by the selectors in the second permutation network, all inputted variables by one shift difference corresponding to the one of the first variable groups; and
outputting respectively all shifted variables from different output ends as a second variable group corresponding to the one of the first variable groups, wherein all the shifted variables are transmitted respectively by selectors on all the second nodes of the last one of the second permutation layers to the output ends,
wherein the one shift difference is determined by a difference between a first target offset corresponding to the one of the first variable groups and a second target offset corresponding to the second variable group, wherein the first target offset is identified according a first sub-matrix corresponding to the one of first variable group among the sub-matrices of the predetermined check matrix, and the second target offset is identified according to a second sub-matrix corresponding to the second variable group among the sub-matrices of the predetermined check matrix,
wherein the first target offset of the initial first variable group is 0.

4. The permutation network designing method according to claim 3,
wherein each of the target offsets is set within a permutation network size range, wherein the permutation network size range is set as 0 to Z,
wherein the shift difference is an even value or an odd value within a permutation network shift range which is set as 0 to (Z−1),
wherein if all the shift differences corresponding to the check matrix are even, the shift type of the check matrix is an even shift type, and the target first permutation layer is the last one of the first permutation layers of the identified first permutation network corresponding to the even shift type check matrix,
wherein if all the shift differences corresponding to the check matrix are odd, the shift type of the check matrix is an odd shift type, and the target first permutation layer is the last one of the first permutation layers of the identified first permutation network corresponding to the odd shift type check matrix,
wherein if all the shift differences corresponding to the check matrix are multiples of P, the shift type of the check matrix is a P-multiple shift type, and the target first permutation layer is the last one of the first permutation layers of the identified first permutation network corresponding to the P-multiple shift type check matrix.

5. The permutation network designing method according to claim 2, wherein the step of disposing the plurality of selectors on the plurality of second nodes of the second permutation network of the permutation circuit comprises: according to the preset fineness value, disposing a set of selectors on each of the second nodes, wherein the amount of the set of the selectors on one second node is set by the preset fineness value.

6. The permutation network designing method according to claim 5, wherein the amount of all the selectors of the second permutation network is $Z*B*F$, wherein Z is the default dimension value, B is the amount of the second permutation layers, and F is the preset fineness value,
wherein the amount of routing wires connecting to every selector in the first one of second permutation layers of the second permutation network is 4, the amount of routing wires connecting to every selector in the rest of second permutation layers of the second permutation network is 3,
wherein the amount of all the routing wires corresponding to all the selectors of the second permutation network is $(Z*F+3*T)$, wherein T is the amount of all the selectors of the second permutation network.

7. The permutation network designing method according to claim 1, wherein the first value is $Log_2(Z)$.

8. A permutation circuit of a quasi-cyclic low-density parity check (QC-LDPC) decoder of an error checking and correcting circuit of a storage controller, wherein the storage controller is configured to control a storage device having a rewritable non-volatile memory module, and the QC-LDPC decoder is configured to perform a decoding procedure on a target codeword, wherein the storage controller further comprising:
a memory interface control circuit, configured to couple to the rewritable non-volatile memory module, wherein the rewritable non-volatile memory module has a plurality of physical pages, and the size of each of the physical pages is identified as a page size, wherein the physical page is configured to store a plurality of codewords, and the target codeword is read from a target physical page among the physical pages, wherein a length of each of the codewords is obtained as a codeword length according to the amount of the codewords and the page size; and
a processor, coupled to the error checking and correcting circuit and the memory interface control circuit, wherein the memory interface control circuit transmits the target codeword read from the rewritable non-volatile memory module to the error checking and correcting circuit, and the processor is configured to instruct the error checking and correcting circuit to perform the decoding procedure on the target codeword,
wherein the permutation circuit comprises a plurality of selectors, a plurality of routing wires connecting to each of the selectors, a plurality of input ends, and a plurality of output ends,
wherein a predetermined check matrix of the QC-LDPC decoder is identified, and the check matrix comprises M×N sub-matrices, wherein each of the sub-matrices is a Z×Z matrix, wherein Z is a default dimension value of each of the sub-matrices, and the default dimension value is a quotient obtained by dividing the codeword length with N, wherein a first value is calculated according to the default dimension value,
wherein a second permutation network for disposing the selectors and routing wires into the permutation circuit is constructed by removing a target first permutation layer from a first permutation network,
wherein the first permutation network is identified according to the first value, the default dimension value, and a shift type of the check matrix, wherein the first permutation network comprises a plurality of first permutation layers arranged sequentially, and each of the first permutation layers has the same amount of first nodes, wherein the amount of the first permutation layers is set by the first value, and the amount of the first nodes of each of the first permutation layers is set by the default dimension value, wherein every first node of one of the first permutation layers connects to a pair of first nodes of the next one first permutation layer among the first permutation layers, wherein the target first permutation layer among the first permutation layers of the first permutation network according to the shift type of the check matrix, wherein a plurality of selectors are disposed on a plurality of second nodes of the second permutation network of the permutation circuit, and a plurality of routing wires are disposed into the permutation circuit to connect the selectors according to the second permutation network, wherein the selectors further respectively connect to a decoding controller of the QC-LDPC decoder, wherein the decoding controller is configured to control the selectors to shift a plurality of first variable groups corresponding to the target codeword as a plurality of second variable groups, wherein the second variable groups are respectively shifted according to a plurality of target offsets corresponding to the first variable groups and the second variable groups, wherein the target offsets are identified according to the check matrix.

9. The permutation circuit according to claim 8, wherein each of the first variable groups comprises a plurality of variables, wherein each of the variables comprises a plurality of bits representing a reliability value, wherein the total amount of the bits is set by a preset fineness value, wherein an initial first variable group among the first variable groups comprises a plurality of initial variables, and the initial variables are obtained by looking-up a decoding table according to the target codeword, or by being converted from the target codeword.

10. The permutation circuit according to claim 9, wherein each of the second nodes of the first one of the second permutation layers connects to each of a plurality of input ends of the permutation circuit, and each of the second nodes of the last one of the second permutation layers connects to two of a plurality of output ends of the permutation circuit, wherein the step of shifting the plurality of first variable groups corresponding to the target codeword as the plurality of second variable groups comprises:
  inputting, by the decoding controller, respectively all the variables in one of the first variable groups into different input ends, wherein all the inputted variables are transmitted respectively to selectors on all the nodes of the first one permutation layers by all the input ends;
  shifting, by the selectors in the second permutation network, all inputted variables by a shift difference corresponding to the one of the first variable groups; and
  outputting respectively all the shifted variables from different output ends as a second variable group corresponding to the one of the first variable groups, wherein all the shifted variables are transmitted respectively by selectors on all the second nodes of the last one of the second permutation layers to the output ends, wherein the shift difference corresponding to the one of the first variable groups is determined by a difference between a first target offset corresponding to the one of the first variable groups and a second target offset corresponding to the second variable group, wherein the first target offset is identified according a first sub-matrix corresponding to the one of first variable group among the sub-matrices of the predetermined check matrix, and the second target offset is identified according to a second sub-matrix corresponding to the second variable group among the sub-matrices of the predetermined check matrix, wherein the first target offset of the initial first variable group is 0.

11. The permutation circuit according to claim 10, wherein each of the target offsets is set within a permutation network size range, wherein the permutation network size range is set as 0 to Z, wherein the shift difference is an even value or an odd value within a permutation network shift range which is set as 0 to (Z−1), wherein if all the shift differences corresponding to the check matrix are even, the shift type of the check matrix is an even shift type, and the target first permutation layer is the last one of the first permutation layers of the identified first permutation network corresponding to the even shift type check matrix, wherein if all the shift differences corresponding to the check matrix are odd, the shift type of the check matrix is an odd shift type, and the target first permutation layer is the last one of the first permutation layers of the identified first permutation network corresponding to the odd shift type check matrix, wherein if all the shift differences are multiples of P, the shift type of the check matrix is a P-multiple shift type, and the target first permutation layer is the last one of the first permutation layers of the identified first permutation network corresponding to the P-multiple shift type check matrix.

12. The permutation circuit according to claim 9, wherein the step of disposing the plurality of selectors on the plurality of second nodes of the second permutation network of the permutation circuit comprises:
  according to the preset fineness value, disposing a set of selectors on each of the second nodes, wherein the amount of the set of the selectors on one second node is set by the preset fineness value.

13. The permutation circuit according to claim 12, wherein the amount of all the selectors of the second permutation network is Z*B*F, wherein Z is the default dimension value, B is the amount of the second permutation layers, and F is the preset fineness value, wherein the amount of routing wires connecting to every selector in the first one of the second permutation layers of the second permutation network is 4, the amount of routing wires connecting to every selector in the rest of permutation layers of the permutation network is 3, wherein the amount of all the routing wires corresponding to all the selectors of the permutation network is (Z*F+3*T), wherein T is the amount of all the selectors of the permutation network.

14. The permutation circuit according to claim 8, wherein the first value is $Log_2(Z)$.

* * * * *